(12) United States Patent
Xu et al.

(10) Patent No.: US 12,224,272 B2
(45) Date of Patent: Feb. 11, 2025

(54) MANUFACTURING MICRO-LED DISPLAYS TO REDUCE SUBPIXEL CROSSTALK

(71) Applicant: Applied Materials, Inc., Santa Clara, CA (US)

(72) Inventors: Lisong Xu, San Jose, CA (US); Byung Sung Kwak, Portland, OR (US); Mingwei Zhu, San Jose, CA (US); Hou T. Ng, Campbell, CA (US); Nag B. Patibandla, Pleasanton, CA (US); Christopher Dennis Bencher, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 330 days.

(21) Appl. No.: 17/701,599

(22) Filed: Mar. 22, 2022

(65) Prior Publication Data

US 2022/0310872 A1    Sep. 29, 2022

Related U.S. Application Data

(60) Provisional application No. 63/166,193, filed on Mar. 25, 2021.

(51) Int. Cl.
    *H01L 25/16*     (2023.01)
    *H01L 25/075*    (2006.01)
    (Continued)

(52) U.S. Cl.
    CPC ........ *H01L 25/167* (2013.01); *H01L 25/0753* (2013.01); *H01L 33/0095* (2013.01);
    (Continued)

(58) Field of Classification Search
    CPC .............. H01L 25/167; H01L 25/0753; H01L 33/0095; H01L 33/483; H01L 33/58;
    (Continued)

(56) References Cited

U.S. PATENT DOCUMENTS 10,048,530 B1   8/2018   Kim et al.
10,141,485 B1   11/2018  Hur et al.
(Continued)

FOREIGN PATENT DOCUMENTS

CN   103236475   8/2013
CN   108257949   7/2018
(Continued)

OTHER PUBLICATIONS

International Search Report and Written Opinion in International Appln. No. PCT/US2022/021430, mailed on Oct. 7, 2022, 11 pages.
(Continued)

*Primary Examiner* — Duy T Nguyen
(74) *Attorney, Agent, or Firm* — Fish & Richardson P.C.

(57) ABSTRACT

A method for manufacturing micro-LED displays includes depositing a first material over a substrate having a plurality of micro-LEDs such that the plurality of micro-LEDs are covered by the first material and the first material fills gaps laterally separating the micro-LEDs, removing a portion of the first material from the gaps that laterally separate the plurality of micro-LEDs to form trenches that extend to or below light-emitting layers of the micro-LEDs, depositing a second material over the substrate such that the second material covers the first material and extends into the trenches, and removing a portion of the first and second material over the plurality of micro-LEDs to expose top surfaces of the plurality of micro-LEDs and such that isolation walls positioned in the gaps between the plurality of micro-LEDs extend vertically higher than the top surface of the first material.

15 Claims, 13 Drawing Sheets

(51) Int. Cl.
    *H01L 33/00*     (2010.01)
    *H01L 33/44*     (2010.01)
    *H01L 33/48*     (2010.01)
    *H01L 33/54*     (2010.01)
    *H01L 33/58*     (2010.01)
    *H01L 33/60*     (2010.01)
    *H01L 33/32*     (2010.01)

(52) U.S. Cl.
    CPC ............ *H01L 33/483* (2013.01); *H01L 33/58* (2013.01); *H01L 33/60* (2013.01); *H01L 33/32* (2013.01); *H01L 33/44* (2013.01); *H01L 33/54* (2013.01); *H01L 2933/0033* (2013.01); *H01L 2933/005* (2013.01); *H01L 2933/0058* (2013.01)

(58) Field of Classification Search
    CPC ......... H01L 33/60; H01L 33/32; H01L 33/44; H01L 33/54; H01L 2933/0033; H01L 2933/005; H01L 2933/0058
    USPC ............................................................ 438/28
    See application file for complete search history.

(56) References Cited

U.S. PATENT DOCUMENTS

| | | | |
|---|---|---|---|
| 11,222,977 | B2 | 1/2022 | Glass et al. |
| 2008/0173884 | A1* | 7/2008 | Chitnis ................. H01L 33/508 257/E33.061 |
| 2010/0295077 | A1 | 11/2010 | Melman |
| 2012/0248485 | A1* | 10/2012 | Shinbori ................ H01L 33/56 257/E33.072 |
| 2012/0285379 | A1 | 11/2012 | Hirakata et al. |
| 2014/0367633 | A1 | 12/2014 | Bibl et al. |
| 2015/0255505 | A1 | 9/2015 | Jeoung et al. |
| 2017/0244010 | A1 | 8/2017 | Kim et al. |
| 2018/0074240 | A1 | 3/2018 | Bonar et al. |
| 2018/0156951 | A1 | 6/2018 | Baek et al. |
| 2018/0277525 | A1 | 9/2018 | Cok et al. |
| 2018/0308420 | A1 | 10/2018 | Shin et al. |
| 2018/0366622 | A1 | 12/2018 | Ulmer |
| 2019/0107755 | A1 | 4/2019 | Chen |
| 2019/0214376 | A1 | 7/2019 | Kim |
| 2019/0312083 | A1 | 10/2019 | Sakong et al. |
| 2020/0066689 | A1* | 2/2020 | Yeon ........................ H01L 33/50 |
| 2020/0152841 | A1 | 5/2020 | Han et al. |
| 2020/0295224 | A1* | 9/2020 | Yanagawa ........... H01L 25/0753 |
| 2020/0365566 | A1 | 11/2020 | Zhang et al. |
| 2020/0365774 | A1* | 11/2020 | Zhang ................. H01L 33/0093 |
| 2021/0126157 | A1* | 4/2021 | Dupre ............... H01L 31/03044 |
| 2021/0151422 | A1 | 5/2021 | Iguchi |
| 2021/0367113 | A1* | 11/2021 | Lin ....................... H01L 33/504 |
| 2022/0310575 | A1 | 9/2022 | Xu et al. |
| 2024/0088116 | A1 | 3/2024 | Xu et al. |

FOREIGN PATENT DOCUMENTS

| | | |
|---|---|---|
| CN | 109638138 | 4/2019 |
| CN | 111066151 | 4/2020 |
| JP | 2007-157404 | 6/2007 |
| JP | 2019-028380 | 2/2019 |
| JP | 2020/085960 | 6/2020 |
| KR | 2020/0055862 | 5/2020 |

OTHER PUBLICATIONS

Office Action in Taiwanese Appln. No. 111110478, dated Sep. 15, 2023, 16 pages (with English summary and search report).
Office Action in Japanese Appln. No. 2023-558486, dated Oct. 8, 2024, 16 pages (with partial English translation).

* cited by examiner

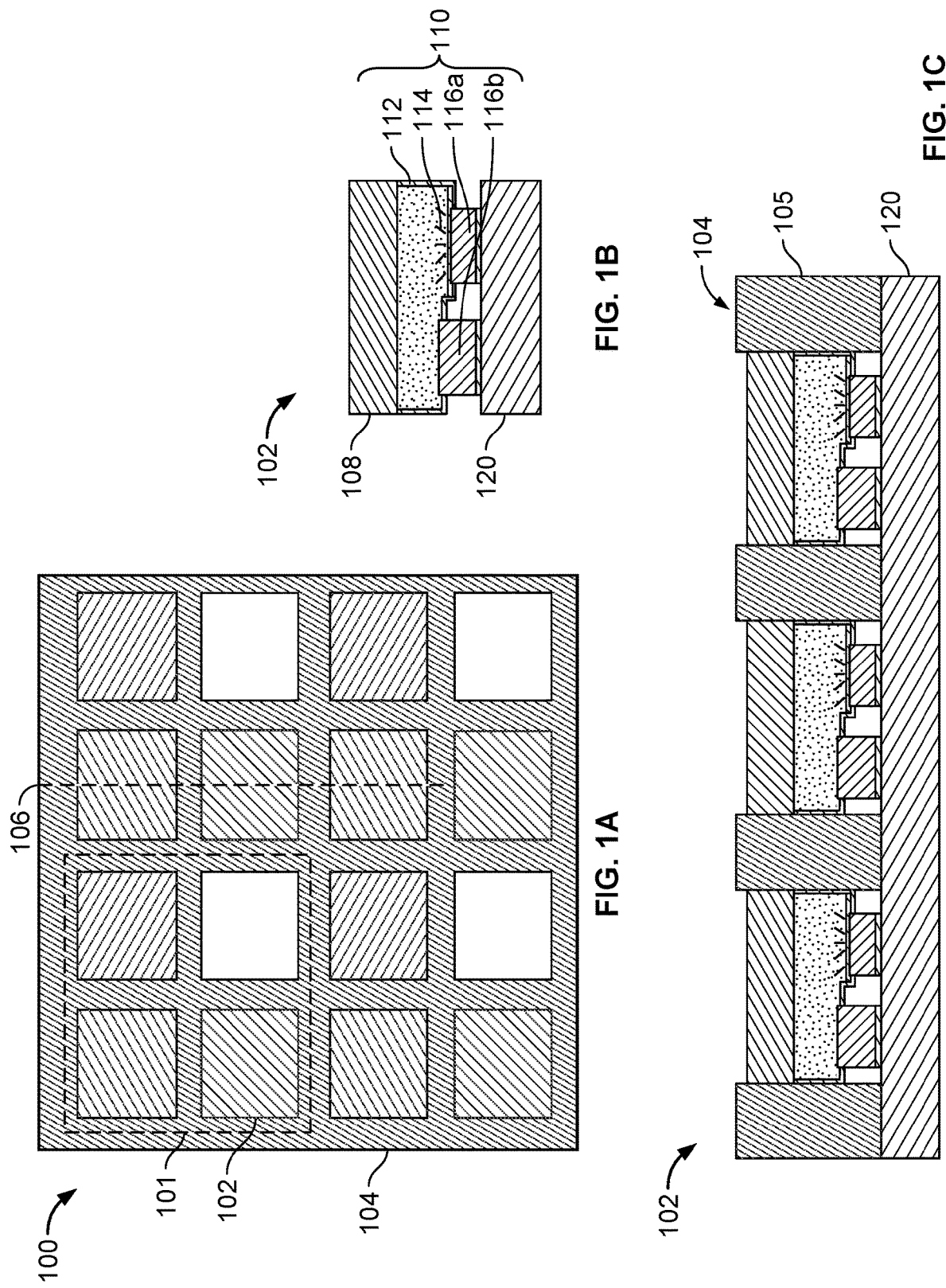

MANUFACTURING MICRO-LED DISPLAYS TO REDUCE SUBPIXEL CROSSTALK

CROSS-REFERENCE TO RELATED APPLICATIONS

This application claims the benefit of priority to U.S. Application No. 63/166,193, filed on Mar. 25, 2021, the contents of which are hereby incorporated by reference.

TECHNICAL FIELD

This specification relates to producing micro-LED displays and specifically to micro-LED displays using opaque material between subpixels.

BACKGROUND

A light-emitting diode (LED) panel uses an array of LEDs, with individual LEDs providing the individually controllable pixel elements. Such an LED panel can be used for a computer, touch panel device, personal digital assistant (PDA), cell phone, television monitor, and the like.

An LED panel that uses micron-scale LEDs based on III-V semiconductor technology (also called micro-LEDs) would have a variety of advantages as compared to OLEDs, e.g., higher energy efficiency, brightness, and lifetime, as well as fewer material layers in the display stack which can simplify manufacturing. However, there are challenges to fabrication of micro-LED panels. Micro-LEDs having different color emission (e.g., red, green and blue pixels) need to be fabricated on different substrates through separate processes. Integration of the multiple colors of micro-LED devices onto a single panel requires a pick-and-place step to transfer the micro-LED devices from their original donor substrates to a destination substrate. This often involves modification of the LED structure or fabrication process, such as introducing sacrificial layers to ease die release. In addition, stringent requirements on placement accuracy (e.g., less than 1 um) limit either the throughput, the final yield, or both.

An alternative approach to bypass the pick-and-place step is to selectively deposit color conversion agents (e.g., quantum dots, nanostructures, florescent materials or organic substances) at specific pixel locations on a substrate fabricated with monochrome micro-LEDs. The monochrome micro-LEDs can generate relatively short wavelength light, e.g., purple or blue light, and the color conversion agents can convert this short wavelength light into longer wavelength light, e.g., red or green light for red or green pixels. For example, the micro-LEDs can emit in the ultraviolet wavelength range (UV-micro-LEDs), and photo-emissive quantum dot (QD) particles can be layered above UV-micro-LEDs to form a subpixel which converts UV backlight to basic colors (e.g., red, green, and blue). An array of four QD/UV-micro-LEDs subpixels, emitting red, green, blue, and white light respectively, form a pixel of a display.

SUMMARY

In one aspect, a method for manufacturing micro-LED displays includes depositing a first material over a substrate having a plurality of micro-LEDs such that the plurality of micro-LEDs are covered by the first material and the first material fills gaps laterally separating the micro-LEDs, removing a portion of the first material from the gaps that laterally separate the plurality of micro-LEDs to form trenches in the first material that extend to or below light-emitting layers of the micro-LEDs, depositing a second material over the substrate such that the second material covers the first material and extends into the trenches in the first material, and removing a portion of the first and second material over the plurality of micro-LEDs to expose a top surface of each of the plurality of micro-LEDs and such that a plurality of isolation walls of the second material positioned in the gaps between the plurality of micro-LEDs extends vertically higher than a top surface of the first material. The second material is an opaque material.

In another aspect, a method for manufacturing micro-LED displays includes depositing a first material over a substrate having a plurality of micro-LEDs such that the plurality of micro-LEDs and substrate exposed between the plurality of micro-LEDs are covered with a first conformal layer of the first material, depositing a second material over the substrate such that the second material covers the first material and fills gaps laterally separating the micro-LEDs, removing a portion of the second material from the gaps that laterally separate the plurality of micro-LEDs to form trenches in the second material that extend to the conformal layer of the first material covering the exposed substrate between the plurality of micro-LEDs, depositing a third material over the second material such that exposed surfaces of the second material and first material are covered with a second conformal layer of the third material, depositing a fourth material over the third material such that the fourth material extends into the trenches in the third material, and removing a portion of the fourth and third material over the micro-LEDs to expose top surfaces of the micro-LEDs and such that isolation walls of the third material and fourth material positioned in the gaps between the micro-LEDs extend vertically higher than the top surface of the first material. The fourth material is an opaque material.

In another aspect, a display screen includes a backplane, an array of light-emitting diodes electrically integrated with the backplane, and a plurality of isolation walls. The light-emitting diodes are configured to emit UV light in a first wavelength range. The plurality of isolation walls are formed on the backplane between adjacent light-emitting diodes of the array of light-emitting diodes with the isolation walls spaced apart from the light-emitting diodes by a gap and extending above the light-emitting diodes. The plurality of isolation walls are formed of an opaque material having transmittance less than 1% of light in the first wavelength range.

In another aspect, a display screen includes a backplane, an array of light-emitting diodes electrically integrated with the backplane, and a plurality of isolation walls. The light-emitting diodes are configured to emit UV light in a first wavelength range. The plurality of isolation walls are formed on the backplane between adjacent light-emitting diodes of the array of light-emitting diodes with the isolation walls spaced apart from the light-emitting diodes and extending above the light-emitting diodes. The plurality of isolation walls include a core of a first material, and a coating covering at least a portion of the core extending above the light-emitting diodes. The coating is an opaque second material having transmittance less than 1% of light in the first wavelength range.

In another aspect a display screen includes a backplane, an array of light-emitting diodes electrically integrated with the backplane, and a plurality of isolation walls. The light-emitting diodes are configured to emit UV light in a first wavelength range. The plurality of isolation walls are formed on the backplane between adjacent light-emitting diodes of the array of light-emitting diodes with the plurality of isolation walls spaced apart from the light-emitting diodes and extending above the light-emitting diodes. The plurality of isolation walls include a lower portion below a top surface of the light-emitting diodes having substantially vertical side surfaces and an upper portion above the top surface of the light-emitting diodes having canted side surfaces.

Advantages of implementations can include, but are not limited to, one or more of the following. The overall display brightness and color gamut can be improved by reducing light losses, color crosstalk between subpixels, and color conversion layer deposition accuracy. The process can increase the possible range of opaque material thickness to achieve increased opacity between subpixels. Additional materials, such as metals, dielectrics, or photoresist layers, can be layered before or after the opaque material to improve the performance of the opaque layers. It may be noted that opaque materials can include both reflective and absorptive materials.

The details of one or more embodiments are set forth in the accompanying drawings and the description below. Other features, aspects, and advantages will become apparent from the description, the drawings, and the claims.

BRIEF DESCRIPTION OF THE DRAWINGS

FIG. 1A is a diagram of a QD/UV-micro-LED (micro-LED) array including sixteen subpixels.

FIG. 1B is a cross-sectional diagram of a subpixel of the array of FIG. 1A, detailing the components of a micro-LED.

FIG. 1C is a cross-sectional diagram of three subpixels of the array of FIG. 1A.

DETAILED DESCRIPTION

Figure 2A:
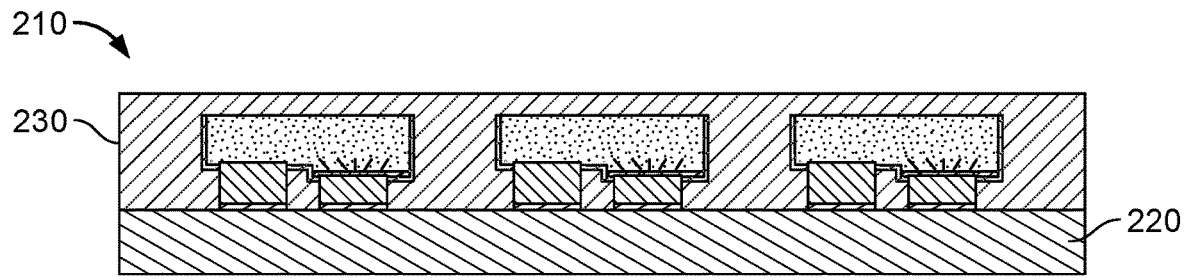
FIGS. 2A-2E illustrate a first process of fabricating opaque walls between subpixels in a micro-LEDs display.

One technique to fabricate a micro-LED display includes curing of a color conversion layer above UV-micro-LED elements. The combination of an isolated color conversion layer and micro-LED beneath forms a subpixel and an array of two or more subpixels, e.g., three or four subpixels, emitting different colors of visible light, e.g., red, green, blue, and/or white (or other primary colors), forms a visual pixel.

An opaque material can separate the subpixels to block light emitted from a micro-LED in one subpixel from stimulating emissions in the color conversion layer in neighboring subpixels, leading to subpixel optical crosstalk and color shift in a displayed image. The opaque material can also prevent curing of the adjacent color conversion layers during subpixel formation steps. In particular, "subpixel/pixel isolation" architectures are needed to maintain color purity (e.g., R being R, G being G, and B being B only). Such color purity can be compromised in a display architecture that uses UV micro-LEDs with color conversion layers due to (1) UV micro-LED illuminating into adjacent color subpixels causing unintended photoluminescence of different color converters, (2) B emission causing adjacent R and G subpixels to photoluminesce, and similarly G emission causing adjacent R subpixels to photoluminesce, and finally, (3) unintended curing of the dispensed color converters in adjacent subpixels, leading to contamination of adjacent subpixels with wrong color converters—during the manufacturing step of self-aligned curing.

It would be desirable to use micro-LEDs that emit UV light, and color conversion layers that convert the emitted UV light into basic colors (e.g., red, green, and blue). Although the opaque materials currently used in micro-LED display production have low transmittance in the visible range, (e.g., less than 1%), this low transmittance does not necessarily extend to the UV range. As a result, use of LED displays using UV-emitting micro-LEDs and color conversion layers can still be subject to crosstalk. Moreover, if the UV-emitting micro-LEDs are used for self-aligned curing of the color conversion layers, i.e., color conversion material of one color (e.g., red) inadvertently deposited over a neighboring subpixel (e.g., green) can be cured, leading to color mixing and altering the perceived color gamut in finished displays, without such "opaque" materials to achieve optical isolation between pixel/subpixels.

To accommodate the use of existing opaque materials while preventing emission crosstalk between subpixels, additional manufacturing steps can be used to decrease the visible and UV transmission between subpixels. As a base process, a primary coating of opaque material is deposited to a higher thickness than underlying UV-micro-LEDs on their substrate. The opaque material is then lithographically removed in areas above the UV-micro-LEDs before the color conversion layers are then sequentially deposited into the subpixels. The opaque material can extend above the deposited color conversion layers to further isolate the emission profiles of each subpixel.

FIG. 1A depicts an example portion of a UV-micro-LED (micro-LED) array 100 including sixteen subpixels 102 separated by opaque walls 104. An array of four subpixels 102 emits different colored light, e.g., red, green, blue, and/or white (or other primary color) light, and forms a pixel 101. However, the techniques described below are applicable to displays using a smaller number of colors, e.g., two or three colors, or a larger number of colors, or a different color gamut. Additionally, the techniques described below are further applicable to displays to all types of pixel and subpixel architectures.

Opaque walls 104 are formed between neighboring subpixels 102 and provide optical (e.g., light) isolation to localize curing of the color conversion layer 108 in a subpixel 102 during production and reduce optical crosstalk between isolated color conversion layers 108 during operation. The opaque walls 104 can be a polymer, e.g., a photoresist, a metal, or a metal coating on an underlying wall of another material, e.g., a polymer. In addition to being opaque, the walls 104 can be reflective, e.g., have greater than 50% reflectivity, e.g., greater than 90%, to light emitted by the underlying micro-LED, and to the light emitted by the color conversion layer 108. In this case, the walls 104 should be a metal or a metal coating on an underlying wall of another material, e.g., a polymer. Rather than reflective, the material can be optically absorptive.

For example, the opaque walls 104 can be composed of a black negative photoresist material with high optical density (e.g., between 0.3 μm$^{-1}$ and 0.5 μm$^{-1}$) in optical wavelength ranges (e.g., between 380 nm and 780 nm), e.g., Daxin Black Matrix. As shown in FIG. 1A, the opaque walls 104 can form a rectangular array with each subpixel 102, although in general other array geometries, e.g., hexagonal or offset rectangular arrays, are also possible. FIG. 1A includes line 106 which indicates the cross-sectional view of FIG. 1C.

FIG. 1B is a cross-sectional view illustrating the individual components of a micro-LED subpixel 102 supported on an electrical connection to a backplane 120 (e.g., a substrate). Each subpixel 102 includes a micro-LED 110 and a color conversion layer 108 overlying the micro-LED 110. Each micro-LED 110 includes a light-emitting layer 112 (e.g., a semi-conductor layer), an active layer 114, and conductive contacts 116a, b. The light-emitting layer 112 can be an n-doped semi-conductor layer (e.g., n-doped gallium nitride (n-GaN)) and the active layer 114 can be a p-doped semi-conductor layer (e.g., p-doped gallium nitride (n-GaN)). In some implementations, the active layer 114 can further include a multiple quantum well (MQW) layer. The contacts 116a, 116b of each micro-LED 110 electrically connect with a backplane 120 fabricated to include the circuitry and electrical contacts to control each micro-LED 110.

FIG. 1C is a cross-sectional view illustrating three subpixels 102 separated by opaque walls 104 composed of an opaque material 105, the walls 104 having a solid rectangular cross-section. In general, upon activation by the control circuitry of the backplane 120, the micro-LED 110 generates UV light (e.g., between 365 nm and 405 nm) which is emitted into the color conversion layer 108. The color conversion layer 108 can include color conversion agents, e.g., quantum dots, nanostructures, florescent materials or organic substances, to absorb the emitted UV light of a first wavelength, and re-emit the light in a second, longer wavelength. For example, the color conversion layer 108 can include color conversion agents which re-emit in a particular color spectrum. For example, a red wavelength spectrum (e.g., 620 nm to 750 nm, or 590 nm to 620 nm) for red subpixels, or a green wavelength spectrum (e.g., 495 nm to 570 nm, or 510 nm to 550 nm) for green subpixels.

As shown in FIG. 1C, the opaque walls 104 laterally separate adjacent subpixels 102 and project above the top surface of respective color conversion layers 108. Assuming a material that is sufficiently opaque in the UV-light range is available, the lateral width of the opaque walls 104 can be sufficient to block transmission of emitted UV light from one subpixel 102 from stimulating the color conversion layer 108 of a neighboring subpixel 102 while still meeting subpixel pitch requirements. The production of the opaque walls 104 consists of coating the micro-LEDs 110 and backplane 120 with one or more layers of opaque material 105 to a depth greater than the top surface of the micro-LEDs 110, followed by a temperature- or light-dependent exposure to cure the opaque material 105. Portions of the opaque material 105 are removed above the light-emitting layers 112 of the micro-LEDs 110, such that only the walls 104 of the opaque material 105 remain.

It is advantageous for fabrication processes to form the walls 104 from polymer, e.g., photoresist. However, given the constraints on subpixel pitch (e.g., ~10 μm), and thus constraints on wall 104 thickness, the available opaque polymer materials 105 to form the opaque walls 104 may not totally block transmission of UV light emitted by the micro-LED 110 (e.g., <1% transmittance through the width of the opaque wall 104).

Wall 104 thickness can also depend on the material 105 properties used to form the wall 104. The walls 104 of FIG. 1C are shown as rectangular isolation walls with corners forming right angles (e.g., 90°) which describe a 'vertical' profile. Alternatively, material 105 can form trapezoidal walls 104 with an aspect ratio defined by the width of the base ($w_b$) of the isolation wall nearest the substrate and the width of the peak ($w_p$) of the isolation wall above the micro-LED 110. Walls 104 in which $w_p > w_b$ (the peak is wider than the base) are said to form 'negative reentrant' profiles, whereas walls in which $w_p < w_b$ (the peak is narrower than the base) are said to form 'positive reentrant' (or tapered) profiles. Vertical- or positive reentrant-profile walls 104 can further reduce inter-well transmission by increasing the thickness of the walls 104 near the light-emitting layer 112 of the micro-LED subpixels 102.

Disclosed herein are methods for producing arrays 100 of micro-LED subpixels 102 which utilize additional production methods and materials to further isolate the emission of each subpixel 102.

FIGS. 2A-2E depict a method of using an under-fill material (e.g., a first material) in addition to the opaque material 105 (e.g., a second material) to beneficially decrease the cross talk between neighboring subpixels 102 and increase durability of the electrical contacts 116a,b of the micro-LEDs 110 to the backplane 120. As shown in FIG. 2A, following the connection of example micro-LEDs 210 to the backplane 220, an under-fill layer 230 is deposited over the micro-LEDs 210 such that the under-fill layer 230 fills the gaps that laterally separate the micro-LEDs 210 and covers the light emitting layer of the micro-LED 210 to a depth. For example, the exposed surface of the light-emitting layer of the micro-LEDs 210 can have a height above the substrate of 10 μm and under-fill layer 230 material can be deposited to a depth of 20 μm, thereby covering the micro-LED 210. The under-fill layer 230 can also flow into vertical gaps between the micro-LEDs 210 and the backplane 220, e.g., to surround the bonding areas on the bottom of the micro-LEDs 210, thereby stabilizing connections to the backplane 220 and reducing thermal stress in operation. The under-fill layer 230 can be deposited by spin coating, slot die coating, or spray coating, or a combination thereof. The depositing method can depend on the composition of the material.

In some implementations, the width of the micro-LED 210 can be 30 μm and the height can rise 10 μm above the top surface of the backplane 220. The distance between neighboring micro-LEDs 210 can be 10 μm, for a total micro-LED 210 pitch of 40 μm. The under-fill layer 230 can be deposited to a depth of 20 μm, thereby covering the micro-LEDs 210 to a depth of 10 μm.

In some implementations, the under-fill layer 230 is a photoresist material, a light-sensitive material used in photolithography to form a patterned coating on a surface. In some implementations, the photoresist material is a positive photoresist material, e.g., a photo-sensitive material that, after exposure, will be removed by a developer in regions exposed to light. Another advantage to using a positive photoresist material as the under-fill layer 230 includes a low thermal expansion coefficient, leading to increased electric connection durability between the micro-LEDs 210 and backplane 220 during operation while the micro-LEDs 210 are generating heat. In addition, air entrained beneath the micro-LEDs 210 can expand when heated during operation, and damage contacts to the backplane 220. The under-fill layer 230 displaces air from beneath the micro-LEDs 210 and prevents thermal expansion damage. In some implementations, the under-fill layer 230 can block at least a portion of the UV light emitted by the micro-LEDs 210. This can reduce UV exposure of backplane 220 components, such as thin film transistors.

In some implementations, the under-fill layer 230 is a redistribution layer (RDL) material, such as a polymer dielectric material, e.g., a positive photoresist.

Figure 2B:
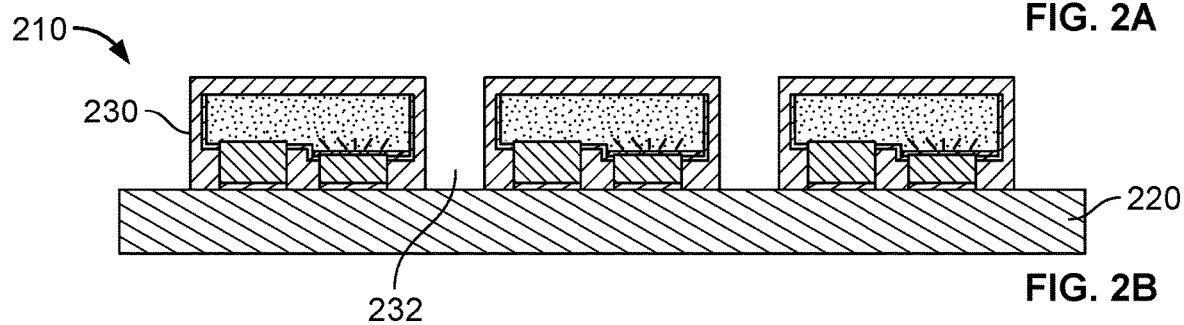

As depicted in FIG. 2B, a portion of the under-fill layer 230 is then removed. The removal method can depend on the material deposited but in general, photolithographic methods can be used to remove photoresist. For example, a positive photoresist material can be used (e.g., SPR™ 220, AZ® 10XT, AZ® 40XT, or AZ® 9260). UV light can be directed through a mask to expose the photoresist and the mask can block light in regions corresponding to the micro-LEDs 210 (but not the gaps between the micro-LEDs 210), and the developer can remove the exposed portions. For example, the mask could be made of a transparent wafer, such as glass, quartz etc., and coated with patterned metal layers covering the regions corresponding to the micro-LEDs 210. Alternatively, a negative photoresist material could be used, and the mask can block light in regions corresponding to the lateral gap (but not the micro-LEDs 210) and the developer can remove the unexposed portions. Removal of portions of the under-fill layer 230 forms trenches in the lateral gaps between micro-LEDs 210 that extend to or below the light emitting layers 212 of the micro-LEDs 210. In some implementations, the trench can extend to and expose portions of the backplane 220.

Figure 2C:
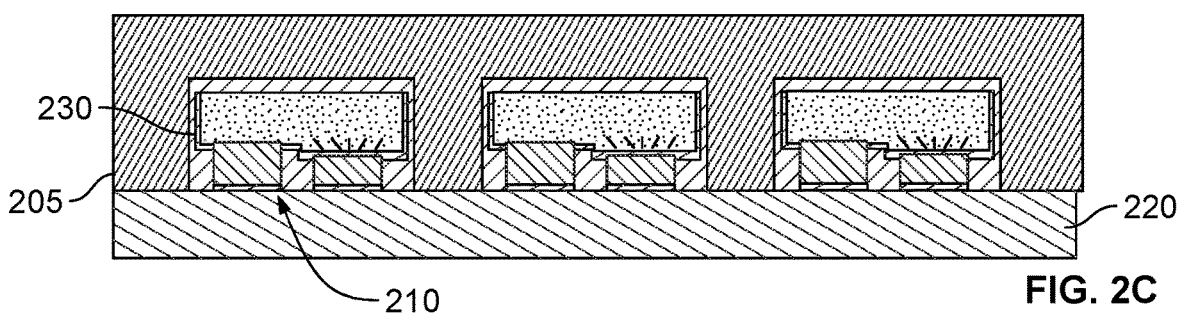

Referring now to FIG. 2C, an opaque material 205 is deposited using methods disclosed above to cover the under-fill layer 230, filling the trenches and covering any exposed backplane 220 to a height above the top surface of the under-fill layer 230. The opaque material 205 is the material used for the opaque walls 104 of FIG. 1B, e.g., black negative photoresist. The opaque material 205 is cured through material-dependent means such as a thermal cure or a masked UV cure.

Figure 2D:
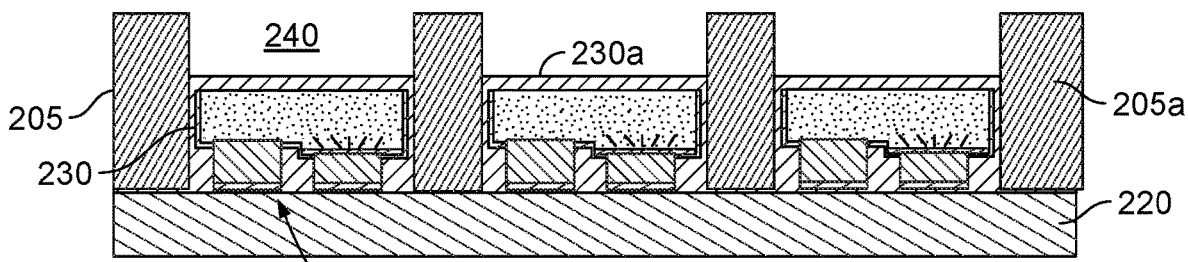

Following the curing step, a portion of the opaque material 205 above the micro-LEDs 210 is removed, as shown in FIG. 2D, until the top surface 230a of the under-fill layer 230 above the micro-LED 210 is exposed. The remaining opaque material 205 forms vertical isolation walls 205a of opaque material 205 in the lateral space between neighboring, covered micro-LEDs 210. These isolation walls 205a of opaque material 205 extend to a height above the top surfaces 230a of the under-fill layer 230. The isolation walls can have a homogenous composition, e.g., the opaque material 205 can have a homogenous composition.

Figure 2E:
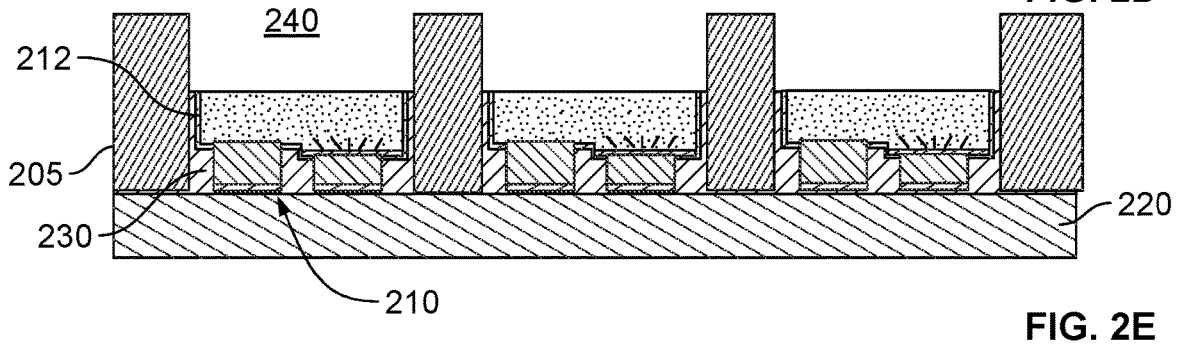

As shown in FIG. 2E, in some implementations, optionally removing remaining under-fill layer 230 covering the top surface of the light-emitting layer 212 can increase light extraction from the underlying micro-LEDs 210. At this point, color conversion materials can be deposited into the wells 240 defined by the space above the under-fill layer 230 and between the walls 205a.

Figure 3A:
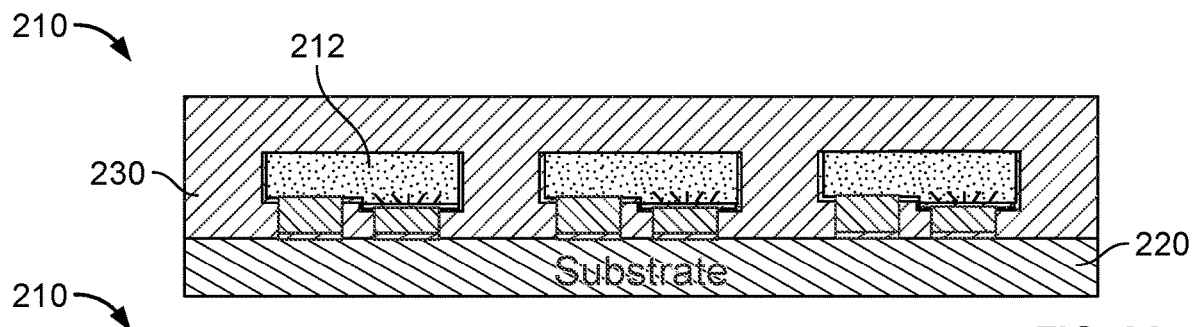
FIGS. 3A-3E illustrate a second process of fabricating opaque walls between subpixels in a micro-LEDs display.
Figure 3B:
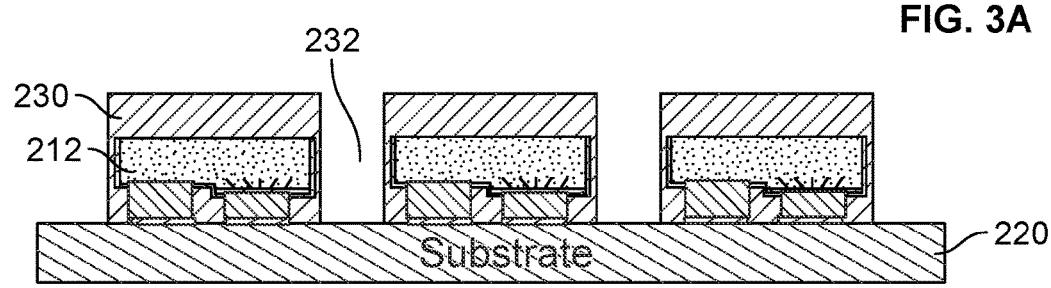
Figure 3C:
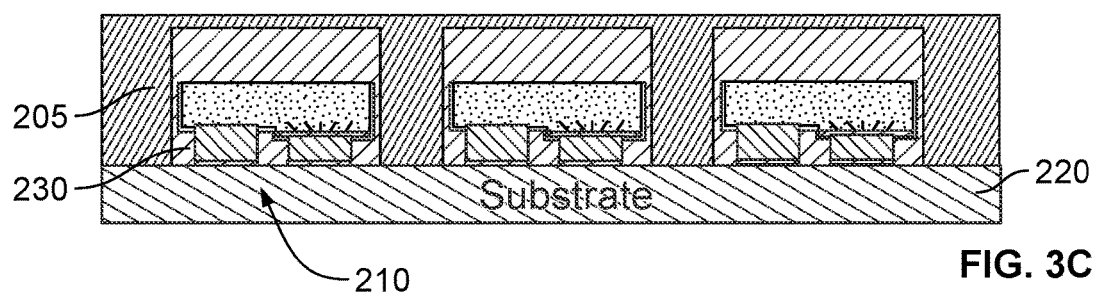
Figure 3D:
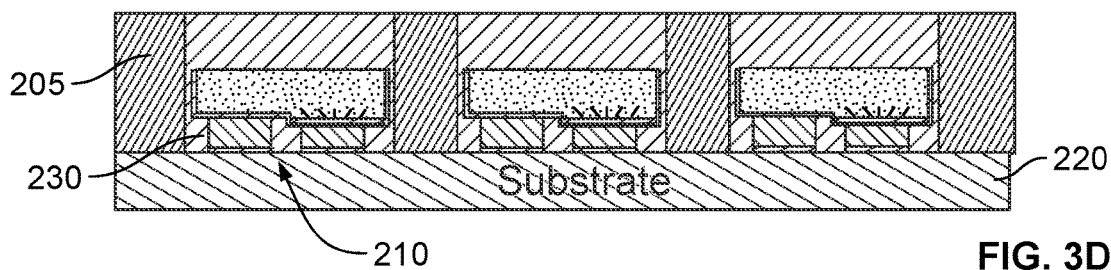
Figure 3E:
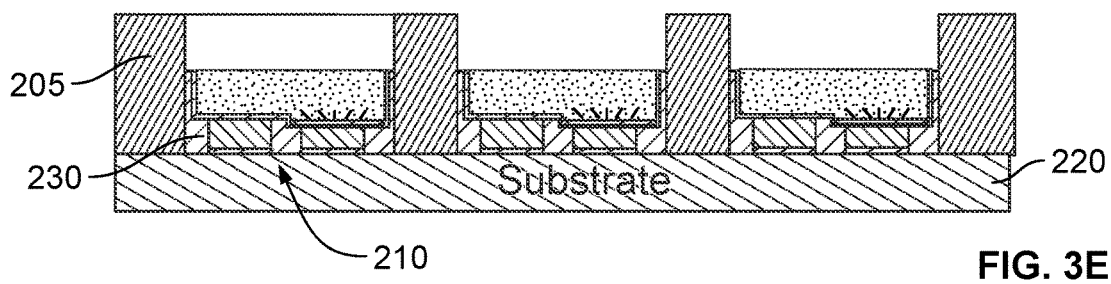

FIGS. 3A-3E illustrate another method of fabricating the under-fill layer 230 and the opaque material 205. The process of FIGS. 3A-3E is similar to the process of FIGS. 2A-2E, except as noted below. As shown in FIGS. 3A and 3B, the under-fill layer 230 is deposited to have a thickness above the backplane 220 equal to the total desired height of the walls of the opaque material. After trenches 232 in the under-fill layer 230 are formed, the opaque material 205 is deposited to fill the trenches. Opaque material above the height of the under-fill layer 230, i.e., over both the under-fill layer 230 and over the trenches that are filled with opaque material, is removed by a planarization process, e.g., plasma etching, until the top surface of the under-fill layer 230 is exposed, thereby forming wells 240 above the micro-LEDs 210. Portions of the under-fill layer 230 remaining over the micro-LED 210 can then be removed using photolithographic techniques before color conversion materials are deposited.

Figure 4A:
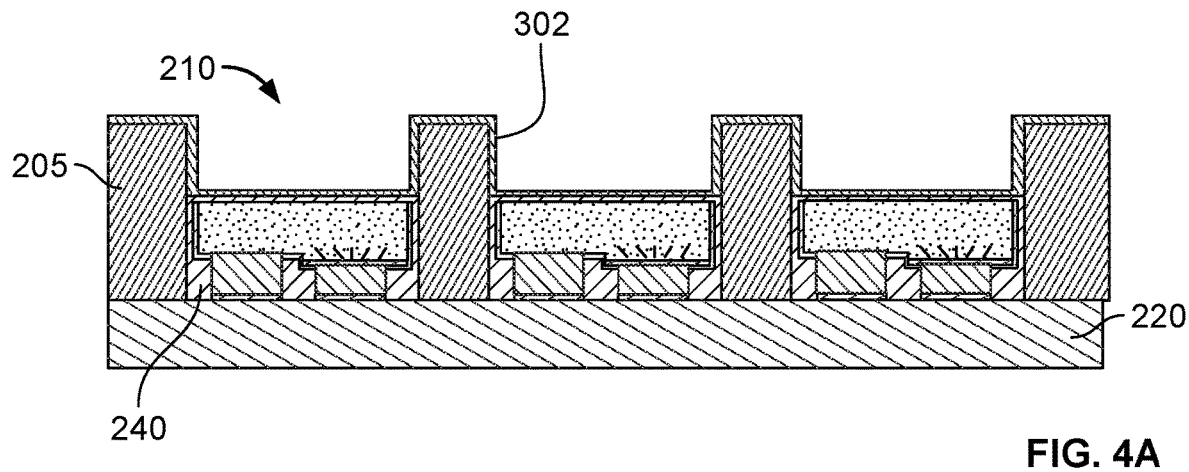
FIGS. 4A-4C illustrate a third process of fabricating opaque walls between subpixels in a micro-LEDs display.
Figure 4B:
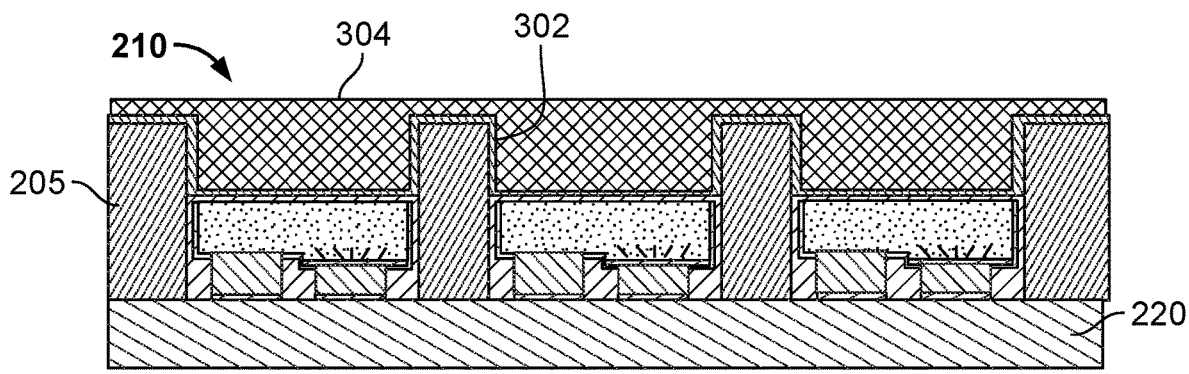
Figure 4C:
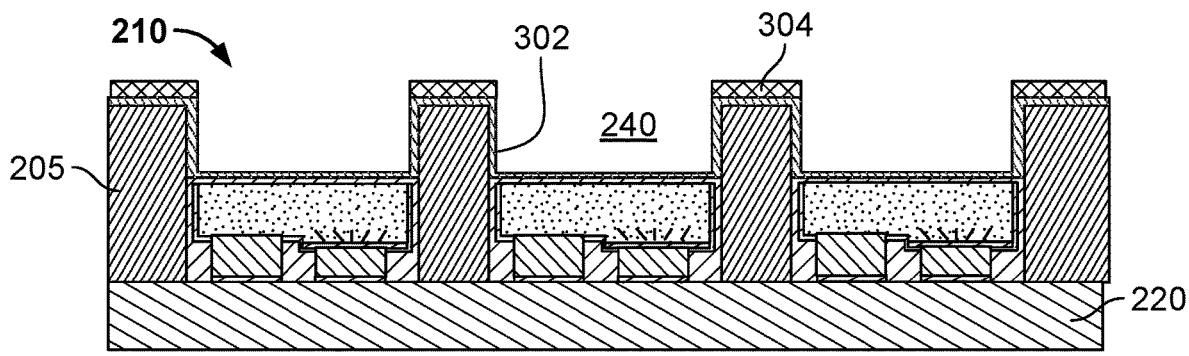

In some implementations, as shown in FIGS. 4A-4C, a layer 302 of an opaque material can be added to further decrease the optical cross talk between micro-LEDs 210 following the removal of the second material 204. FIG. 4A depicts the arrangement of FIG. 2D or 3D, following the removal of material 205 from the top surface of the under-fill layer 230. The opaque material is deposited to cover the exposed surfaces of the under-fill layer 230 and second material 205.

The opaque material of the layer 302 can have higher opacity than the second material 205. In particular, if the third material is sufficiently opaque, the material 205 of the pillars 205a need not be particularly opaque, which can significantly increase the range of compatible materials and thus improve ease of manufacturability. For example, if the opaque material is opaque, e.g., <1% light transmission, the second material 205 may be nearly transparent (e.g., >95% transmission). In some implementations, the opaque material is reflective to optical wavelengths. In some implementations, the opaque material is a metal (e.g., a metallic layer), such as aluminum, gold, silver, platinum, or alloy thereof.

The layer 302 can be deposited in a conformal layer, e.g., of generally uniform depth across the exposed surfaces, and can be relatively thin compared to isolation wall 205a and under-fill layer, e.g., between 50 nm and 300 nm. The layer can be deposited using metal deposition techniques such as plasma-assisted chemical vapor deposition (PCVD), thermal evaporation, or electron beam deposition. Depending on the deposition technique utilized, the layer 302 covering the vertical surface of isolation wall 205a can be thinner than the layer 302 covering the peak of the isolation wall 205a. The opaque material increases optical reflectivity which increases emissivity of deposited color conversion layers 108 and reduces UV transmission through the width of the isolation walls separating micro-LEDs 110.

FIG. 4B depicts the deposition of a photoresist layer 304 (e.g., a fourth material), such as a photoresist material (e.g., a positive or a negative photoresist material) to cover the layer 302 of opaque material. The photoresist layer 304 provides a mask when removing a portion of the layer 302 of opaque material. The photoresist layer 304 is exposed to UV light through a mask and developed to define the regions of the opaque material to be removed. These regions correspond to covered micro-LEDs 210 (but not the isolation walls or walls between the micro-LEDs 210). The opaque material of the layer 302 is removed using appropriate techniques, such as wet or dry etching, and FIG. 4C depicts the final configuration following the removal of the un-masked portions of the layer 302 and photoresist layer 304 above the light-emitting layers 212 of the micro-LEDs 210. The layer 302 provides additional protection for the second material 204 (e.g. under-fill layer) and further decreases optical cross talk between neighboring micro-LEDs 210. If present, the portion of the photoresist layer 304 on top of the isolation wall can also serve to decrease optical cross talk. However, in some implementations the portion of the photoresist layer 304 on top of the isolation wall is completely removed.

In some implementations, additional protective materials can be deposited prior to the under-fill layer 230 of FIG. 2A to coat the backplane 220 and electrically connected micro-LEDs 210 to prevent damage to the connections and further electrically isolate the electrical contacts of individual micro-LEDs 210. For example, the dielectric coating can electrically isolate metal layers that are deposited to form part of the optical barrier from the backplane. FIGS. 5A-5H depict an example process layering additional protective materials in an alternative process to that described in FIGS. 2A-2E.

Figure 5A:
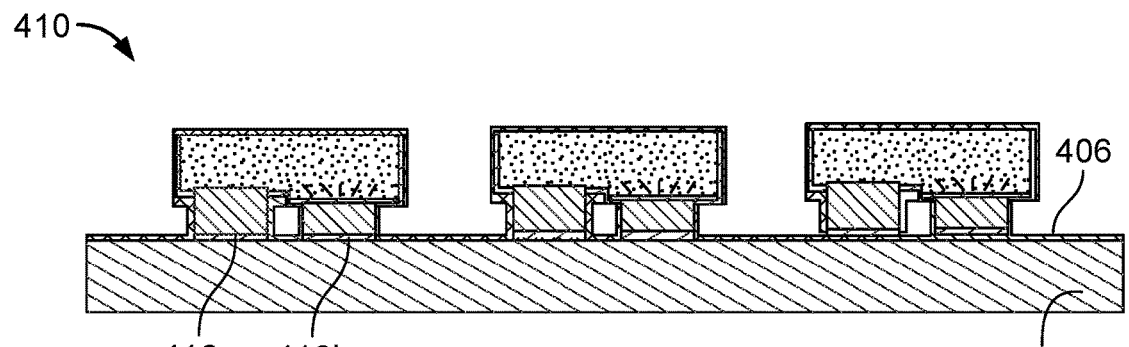
FIGS. 5A-5N illustrate a fourth process of fabricating opaque walls between subpixels in a micro-LEDs display.
Figure 5B:
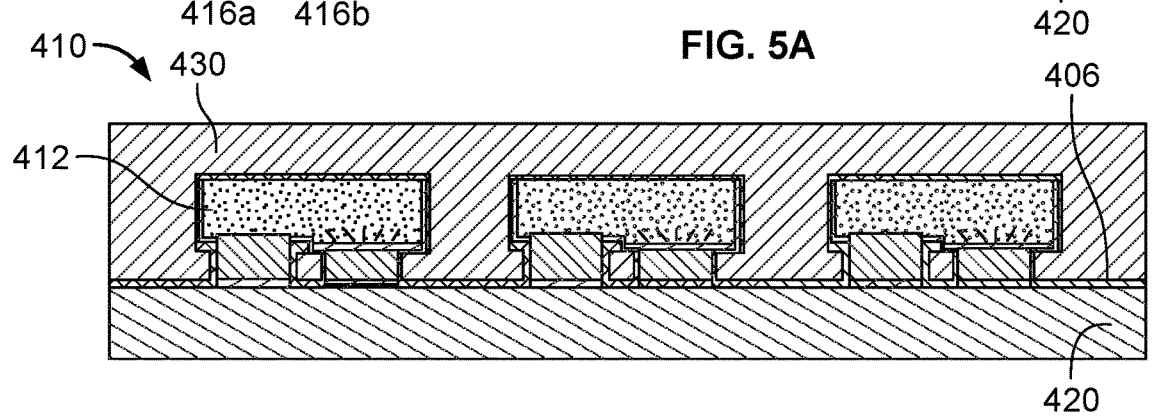

FIG. 5A depicts the deposition of a priming dielectric material 406 layer (e.g., a dielectric layer) to coat the top and lateral surfaces of the micro-LEDs 410 and exposed surfaces of the conductive contacts 416a,b and the backplane 420. For example, the dielectric material 406 can be composed of a nitride material such as silicon nitride (SiN) or aluminum nitride (AlN), or an oxide material such as silicon dioxide (SiO2), or aluminum oxide (Al2O3). The dielectric material 406 can have a dielectric constant of 5 or more (e.g., 5 or more, 6 or more, or 7 or more). The dielectric material 406 can be deposited in a thin layer (e.g., between 100 nm and 500 nm) conforming to and encasing the features of the micro-LEDs 410. An under-fill material 430 is then deposited, as shown in FIG. 5B, to cover the light-emitting layer 412 and fill the lateral gap between neighboring micro-LEDs 410. The under-fill material 430 can be any material as described above.

Figure 5C:
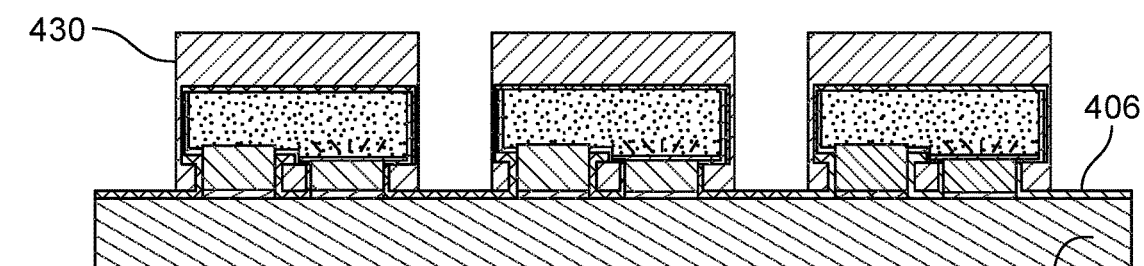

FIG. 5C shows the removal of portions of the under-fill material 430 to form trenches in the gap between neighboring micro-LEDs 410 and exposing the dielectric material 406 coating the backplane 420. The under-fill material 430 is removed using a method described above.

Figure 5D:
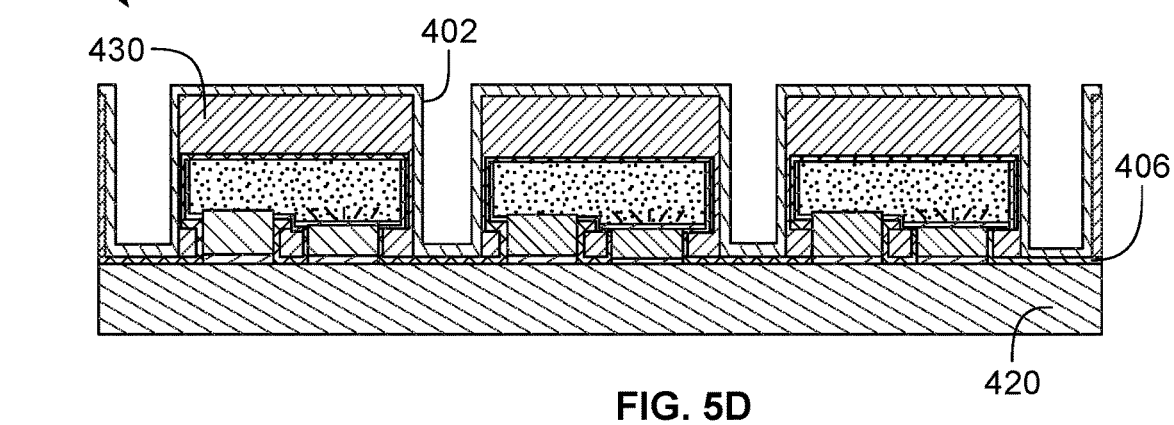

As shown in FIG. 5D, an opaque layer 402, e.g., a reflective layer, is deposited to cover the top and lateral surfaces of the exposed under-fill material 430 and the dielectric material 406 on the backplane 420. The opaque layer 402 needs not to fill the gap between micro-LEDs 410, and can leave trenches to be filled in by an additional material coating. The opaque layer 402 can be conductive. The opaque layer 402 can be a metal, e.g., aluminum, gold, silver, platinum, or alloy thereof.

Figure 5E:
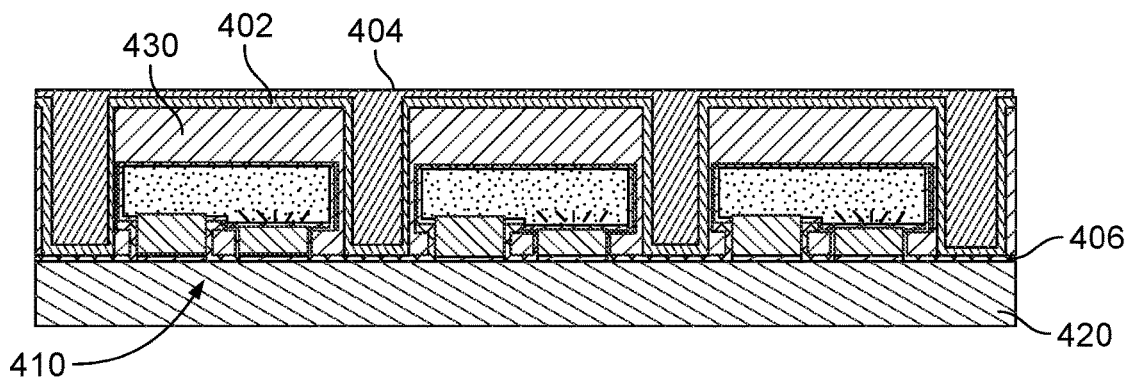
Figure 5F:
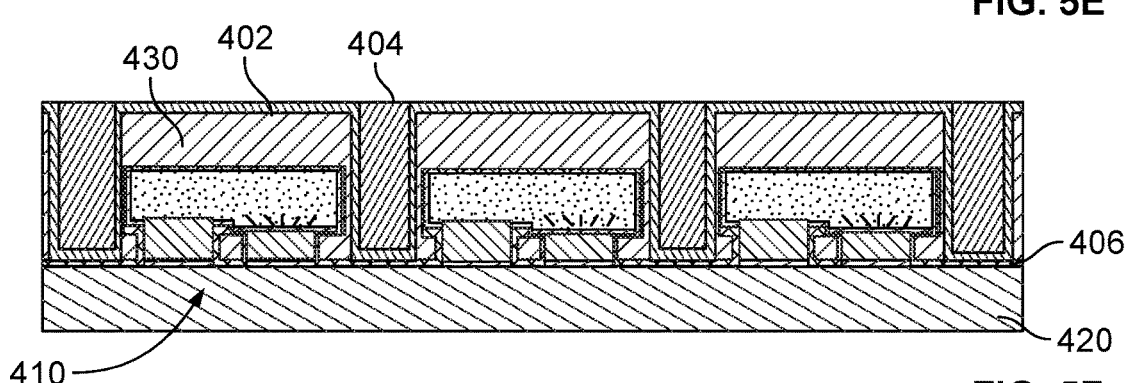

As shown in FIG. 5E, the trenches are filled by opaque wall material 404 and any excess material 404 above the opaque layer 402 is removed, as in FIG. 5F, e.g., by plasma etching, thereby exposing the opaque layer 402 above the light-emitting surfaces of the micro-LEDs 410. Following material 404 removal, the opaque wall material 404 is cured using temperature- or UV-curing.

Figure 5G:
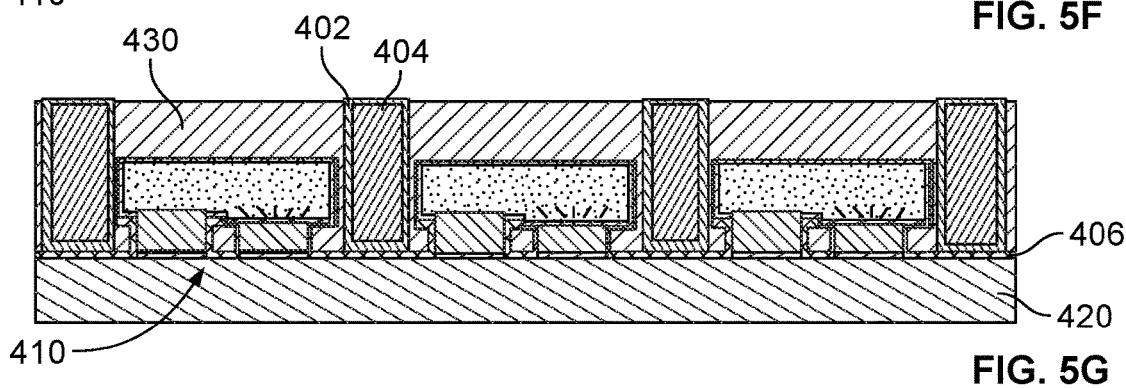
Figure 5H:
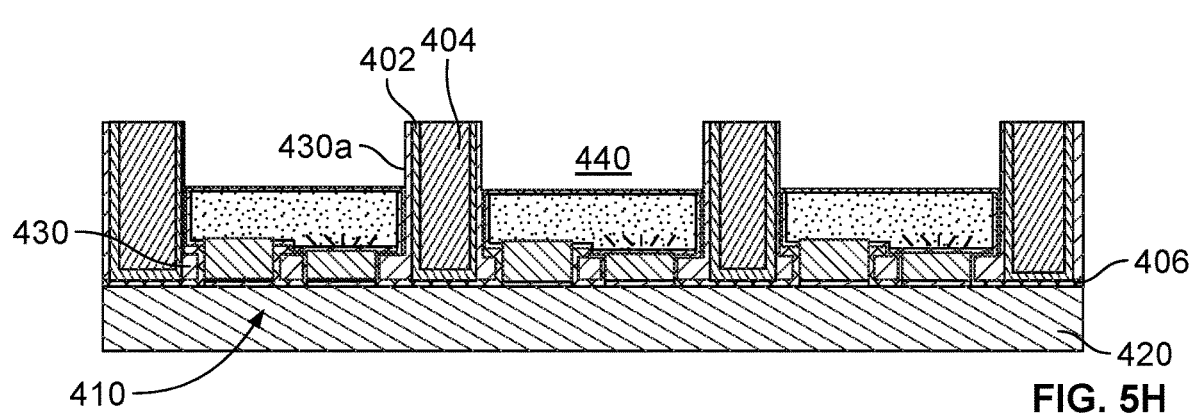

The exposed opaque layer 402 above the micro-LEDs 410 is removed through etching techniques, resulting in the depiction of FIG. 5G, which exposes under-fill material 430. A portion of the under-fill material 430 is removed, creating wells 440 above the micro-LEDs 410. As shown in FIG. 5H, the under-fill material 430 can be removed to a depth which exposes the protective dielectric material 406 above the light-emitting surfaces of the micro-LEDs 410. The under-fill material 430 below the top surface of the micro-LEDs 410, e.g., between the LED and backplane, need not be removed.

Figure 5I:
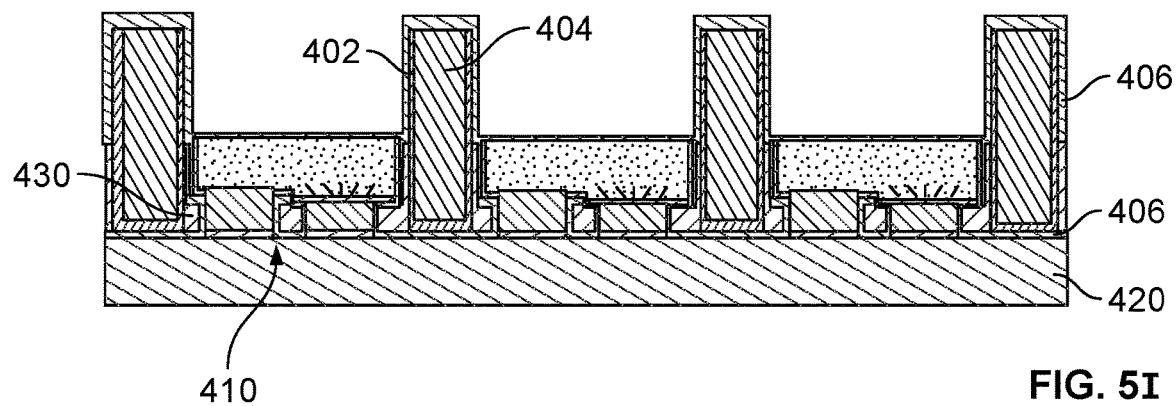

The removal of the under-fill material 430 can maintain a portion of the fill material 430 as a coating 430a on the vertical surfaces of the opaque layer 402 extending above the micro-LEDs 410. For example, the coating 430a on the vertical surface of the opaque layer 402 can have a horizontal depth in a range from 0.5 μm to 2 μm. This coating 430a can increase the structural stability of the opaque layer 402. In some implementations, the dielectric material 406 above the micro-LEDs 410 can optionally be removed to increase the light extraction from the micro-LEDs 410. Alternatively, under-fill material 430 could be removed without leaving a coating on the vertical surfaces of the opaque layer 402. In some implementations, as shown in FIG. 5I, additional dielectric material 406 is deposited on the top and side surfaces of the isolation wall.

Figure 5J:
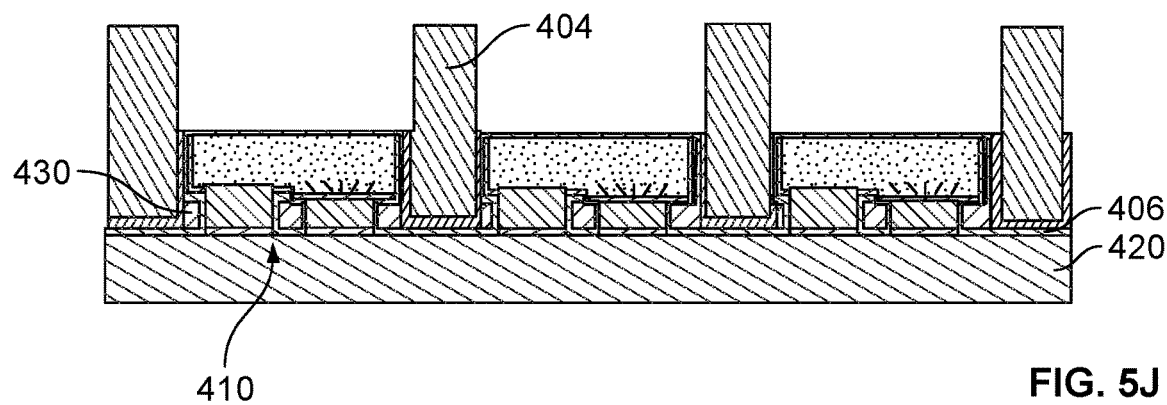
Figure 5K:
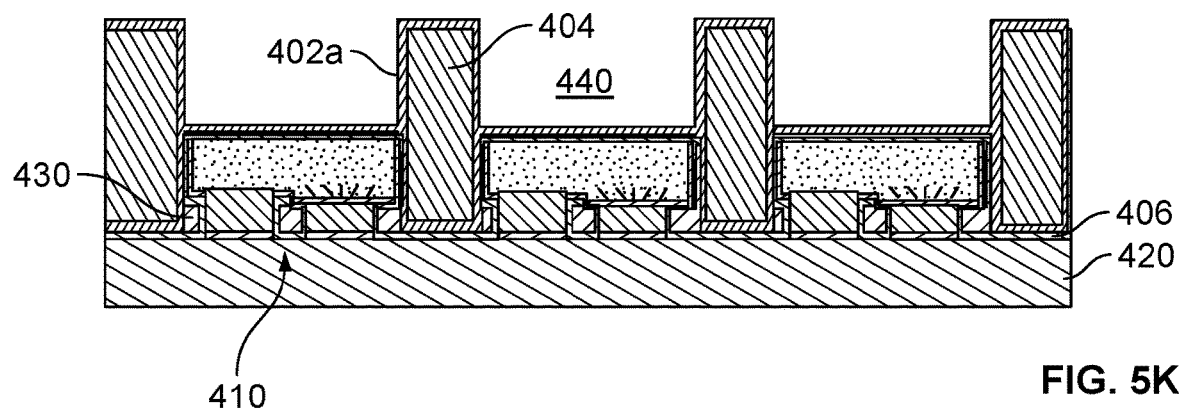
Figure 5L:
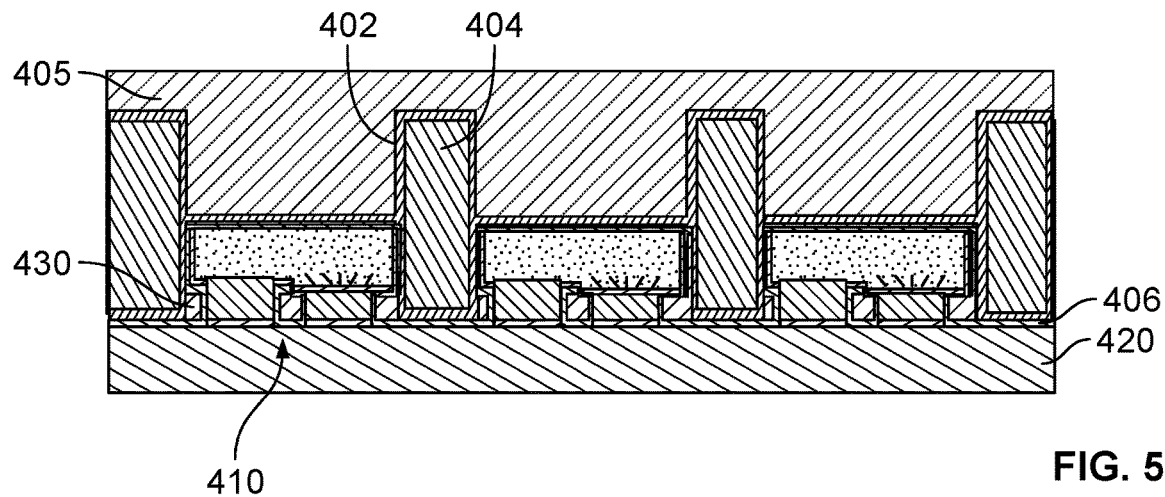

As an alternative to dielectric material 406, an additional layer of first metallic layer 402a can be deposited. In some implementations, opaque material 402 from side surfaces of the isolation walls of FIG. 5H is removed, as shown in FIG. 5J. Then as shown in FIG. 5K, an additional layer of first metallic layer 402a is deposited onto exposed surfaces including the top and side surfaces of the isolation wall and onto the light-emitting layers of the micro-LEDs 410. As shown in FIG. 5L, a photoresist layer 405 can be deposited into the well 440 areas of FIG. 5K that covers the top surface of the opaque material 402 layer to a depth. In some embodiments, the photoresist layer 405 material can be the same as the under-fill material 430 material.

Figure 5M:
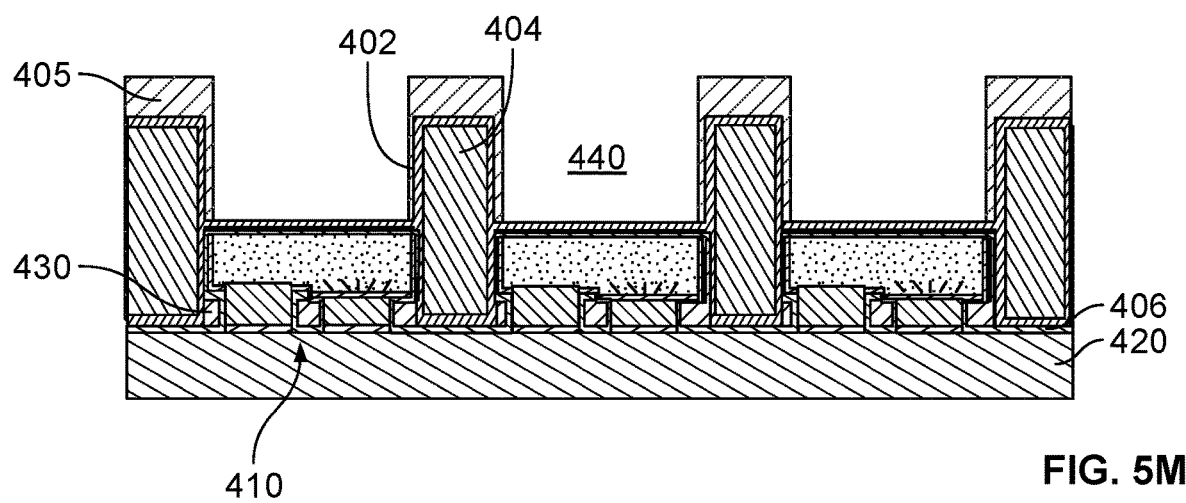
Figure 5N:
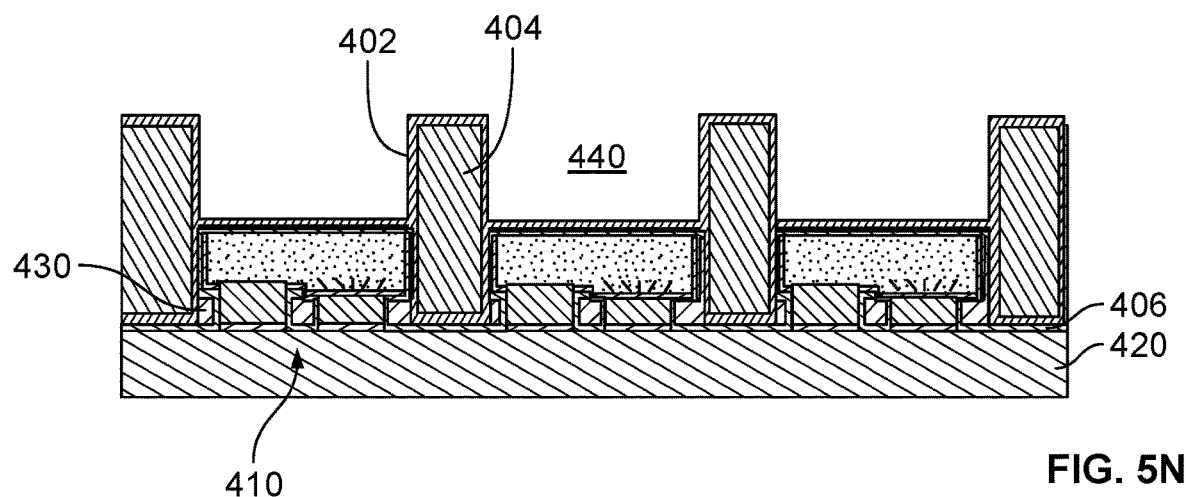

Portions of the photoresist layer 405 can be removed using methods described to create a well 440 area above the micro-LEDs 410 (FIG. 5M). The well 440 areas define a mask for removing portions of the opaque material 402 above the light-emitting areas of the micro-LEDs 410. The opaque material 402 can be removed (e.g., etched) and remaining portions of photoresist layer 405 are removed (e.g., developed). In some embodiments, portions of photoresist layer 405 may remain on the vertical isolation wall surfaces coated in opaque material, as described with respect to FIG. 5H. FIG. 5N depicts the terminal arrangement in which the opaque layer 402 covers the top and side surfaces of the wall material 404 further decreasing optical cross talk between neighboring micro-LEDs 210.

Alternatively, in some implementations the void-filling material 404 of FIGS. 5E-5N can be a transparent or semi-transparent material, e.g., a material with a transmittance greater than 1%, e.g., a transmittance of 1-50%, instead of the opaque wall material, to reduce the number of exposure and development steps in the lithographic removal of the materials involved. For example, the void-filling material 404 can be a photoresist material, such as SU-8.

As an alternative process to the steps depicted in FIGS. 5A-5N, FIGS. 6A-6H depict a process in which additional protective layers can be deposited before forming the interstitial isolation walls between neighboring micro-LEDs 210. Following the deposition of the priming dielectric material 406 (e.g., the dielectric layer) shown in FIG. 5A, a metallic layer 402b, e.g., a reflective layer, is deposited to cover the top and lateral surfaces of the dielectric material 406 on the backplane 420, shown in FIG. 6A.

Figure 6A:
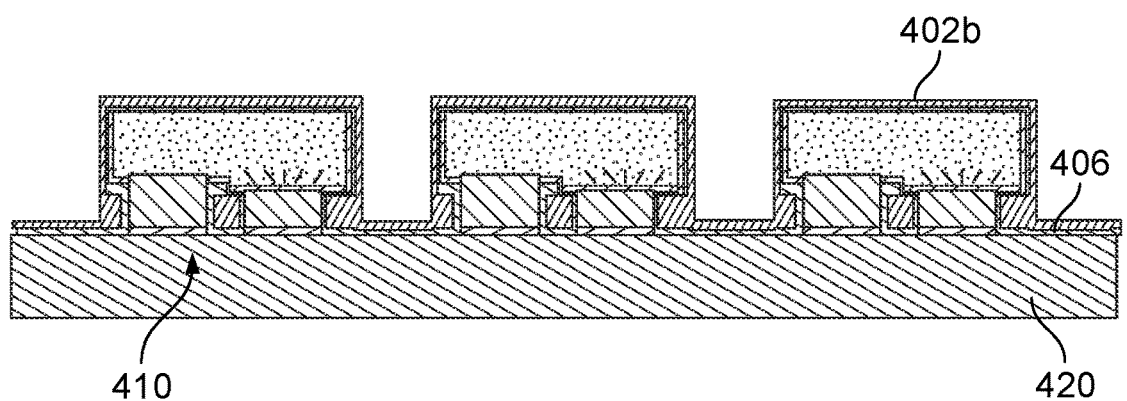
FIGS. 6A-6H illustrate a fifth process of fabricating opaque walls between subpixels in a micro-LEDs display.
Figure 6B:
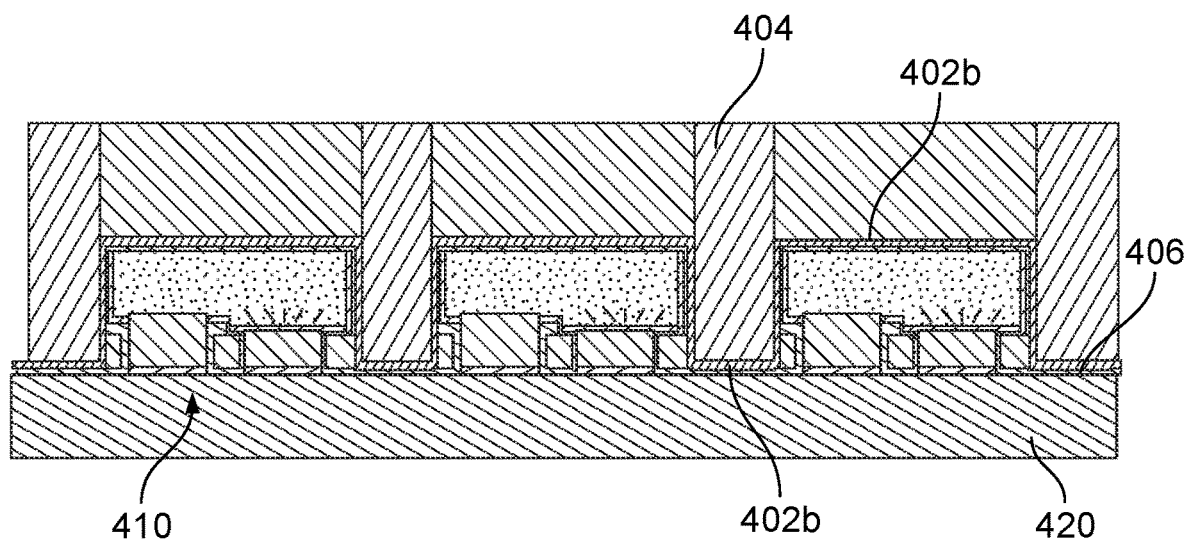

As shown in FIG. 6B, the trenches separating micro-LEDs 410 are filled and the micro-LEDs 410 are covered by wall material 404 to a depth, similar to the process of FIG. 5B. The opaque layer 404 can additionally under-fill the gap between micro-LEDs 410 and backplane 420 thereby providing additional protection of the electrical contact connections between the micro-LEDs 410 and the backplane 420, whereas the priming dielectric material 406 maintains electrical isolation of the individual contacts.

Figure 6C:
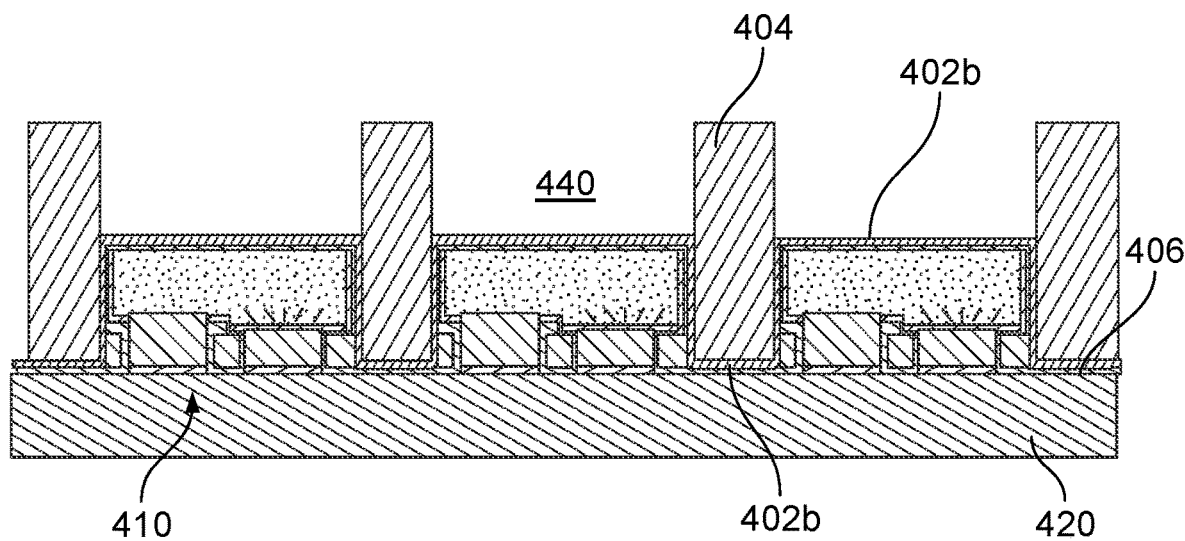
Figure 6D:
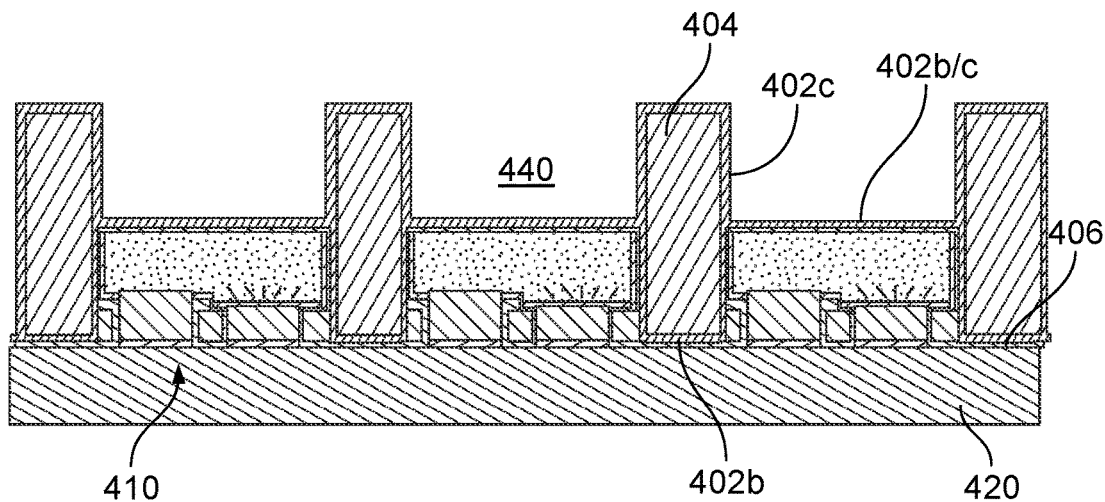

Referring to FIG. 6C, portions of the material 404 are removed, as described above, to create isolation walls of wall material 404 and wells 440 above the micro-LEDs 410 while maintaining the metallic layer 402b along the lateral and top surfaces of the micro-LEDs 410. As depicted in FIG. 6D, an additional metallic layer 402c is deposited onto the lateral and top surfaces of the wall material 404 isolation walls as well as the top surfaces of the micro-LEDs 410, thereby covering the exposed surfaces. The additional metallic layer 402c (which is a second metallic layer) can have the same composition as or a different composition from the metallic layer 402b.

Figure 6E:
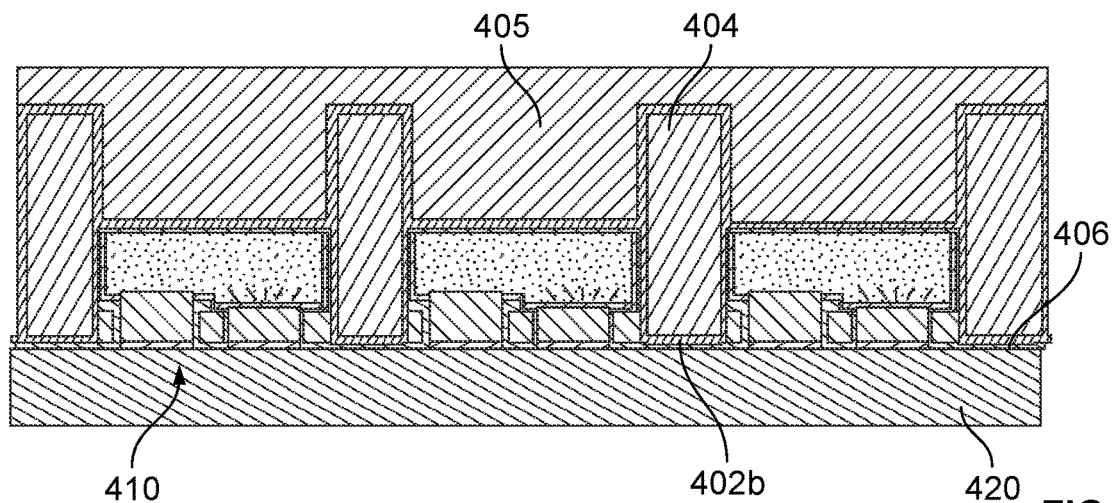

Similar to the process depicted in FIGS. 5K-5N, FIGS. 6D-6H depict the creation of the second metallic layer over the isolation walls. In FIG. 6D, the additional metallic layer 402c is deposited onto the exposed surfaces of the isolation walls of wall material 404 and the dielectric material 406 covering the micro-LEDs 410. Depositing the additional metallic layer 402c segregates the wall material 404 and forms an isolation wall core. A photoresist layer 405, e.g., a positive photoresist, is deposited over the second metallic layer 402c to a depth covering the top of the isolation walls as shown in FIG. 6E.

Figure 6F:
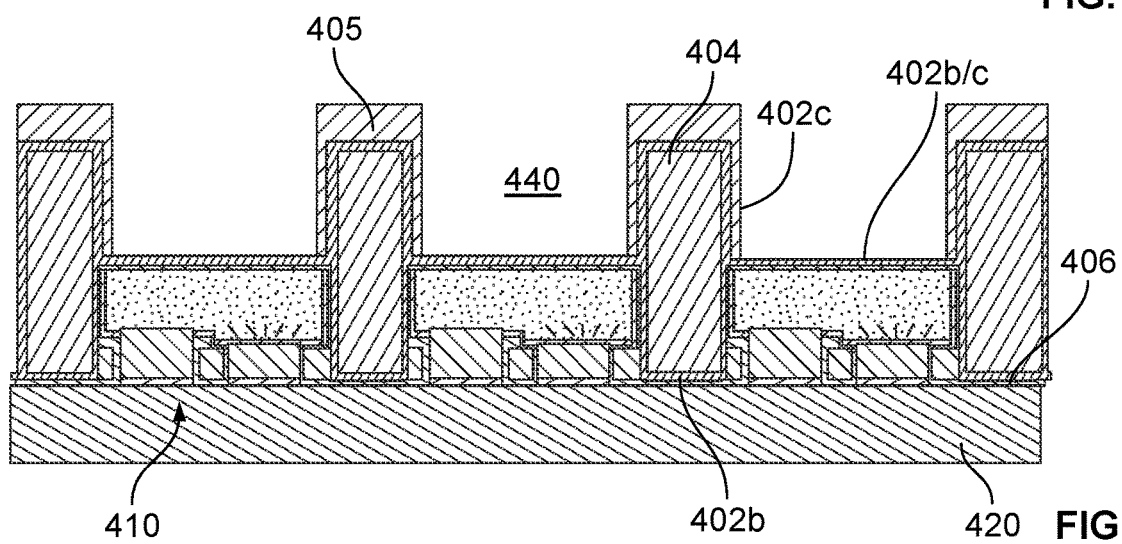
Figure 6G:
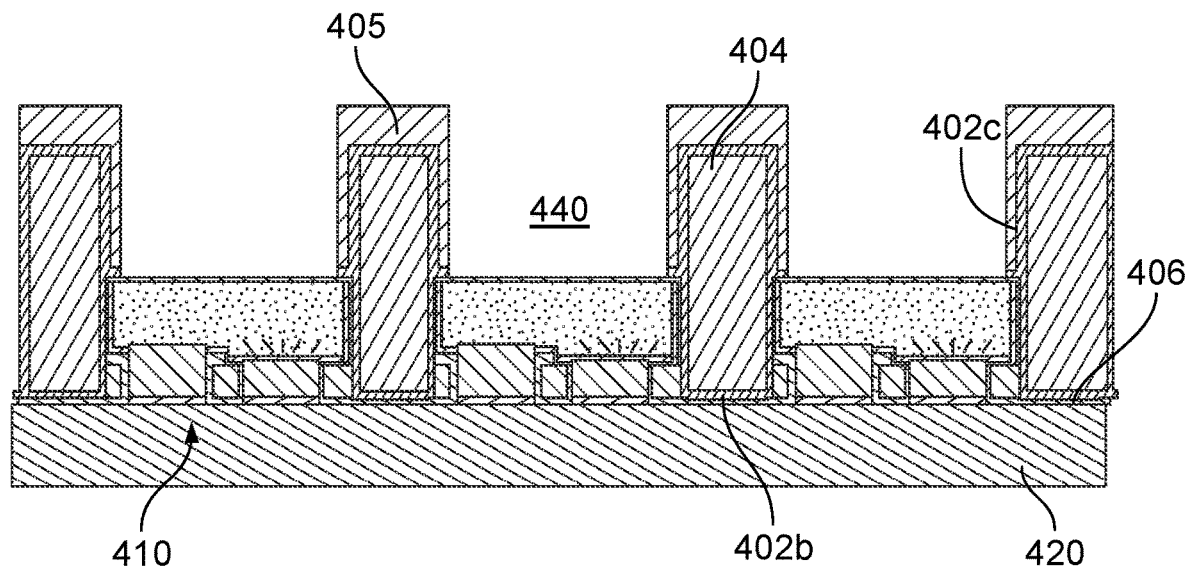
Figure 6H:
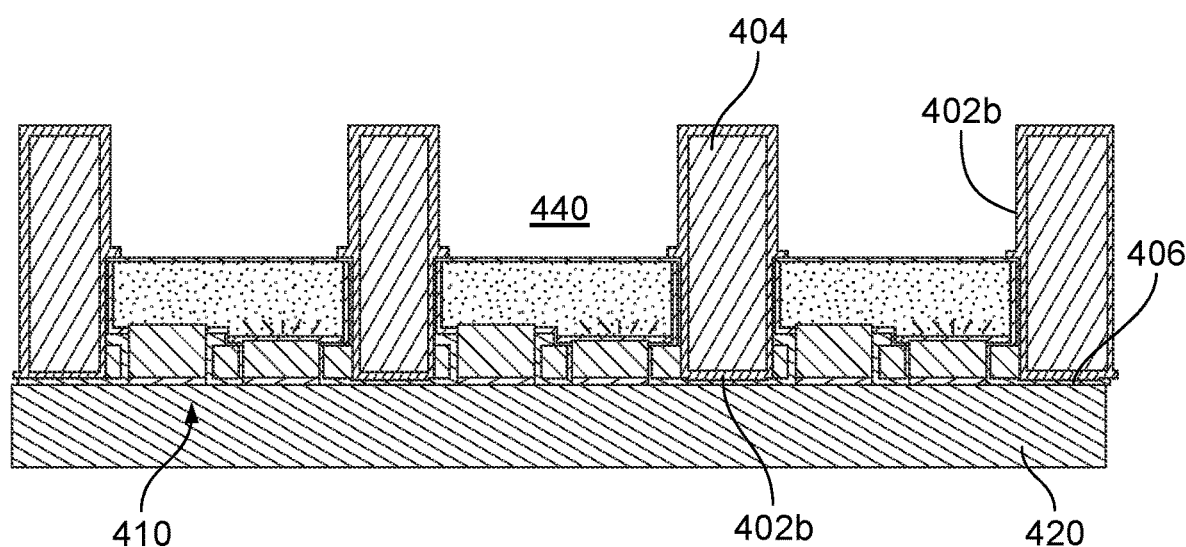

FIG. 6F depicts the photoresist layer 405 as developed and areas above the micro-LEDs 410 removed, creating wells 440. Using the remaining photoresist layer 405 as a mask, the metallic layer 402b/c above the micro-LEDs 410 can then be removed, exposing the light-emitting surface, as shown in FIG. 6G. Any remaining photoresist layer 405 is then removed, as in FIG. 6H, leaving the first metallic layer 402a and second metallic layer 402b covering the isolation wall of wall material 404 extending above the light-emitting surfaces of the micro-LEDs 410.

In various implementations, the isolation wall material 404 extending above the light-emitting surfaces of the micro-LEDs 410 may be canted, e.g., form a non-90° angle with respect to the backplane 420. FIGS. 7A-7F depict the metallization process of FIGS. 6A-6H in which the isolation wall material 404 is canted. However, the techniques can be applied to other processes described above.

Figure 7A:
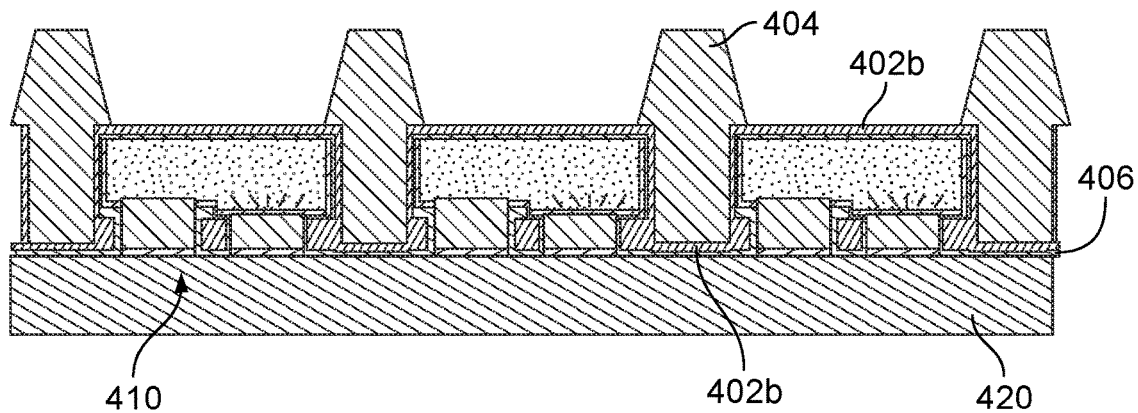
FIGS. 7A-7F illustrate a sixth process of fabricating opaque walls between subpixels in a micro-LEDs display Like reference numbers and designations in the various drawings indicate like elements.
Figure 7B:
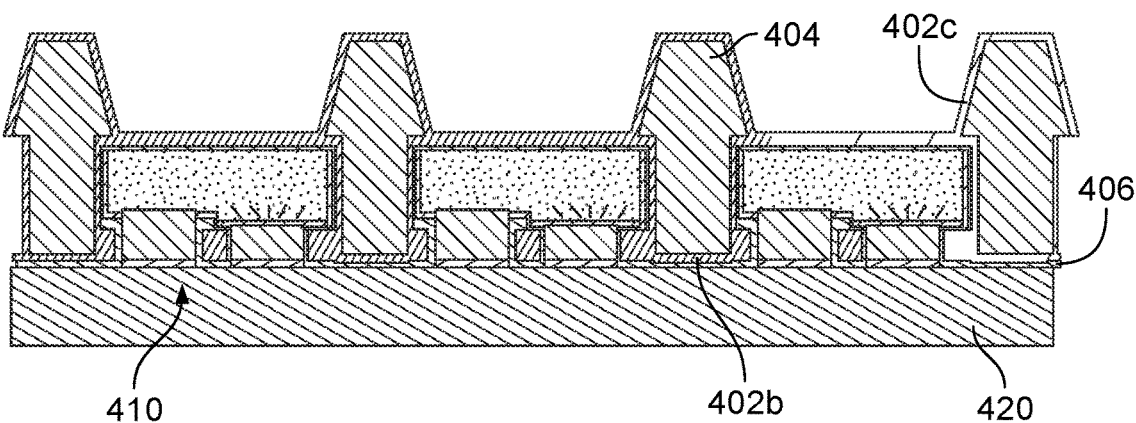
Figure 7C:
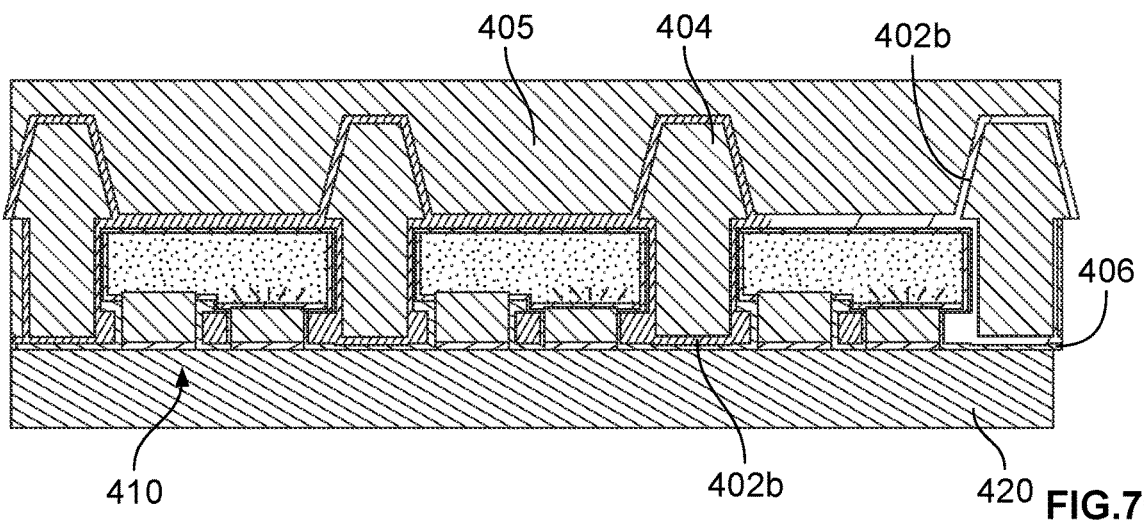
Figure 7D:
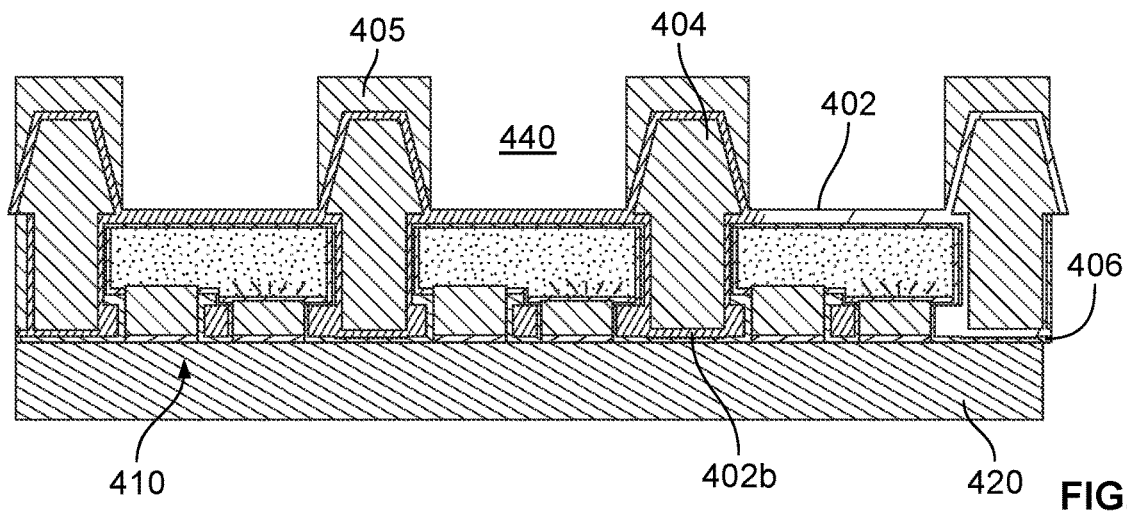
Figure 7E:
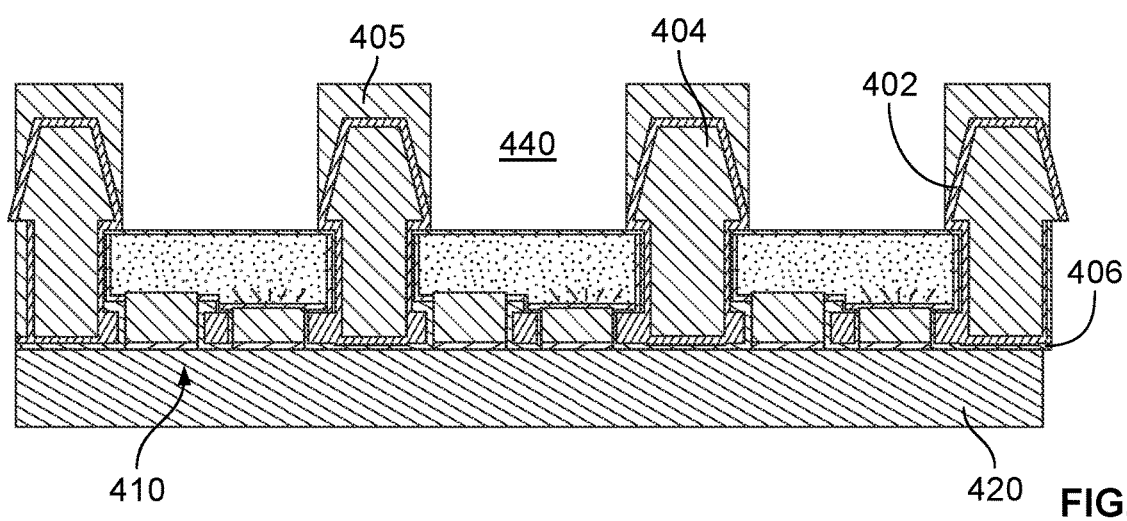
Figure 7F:
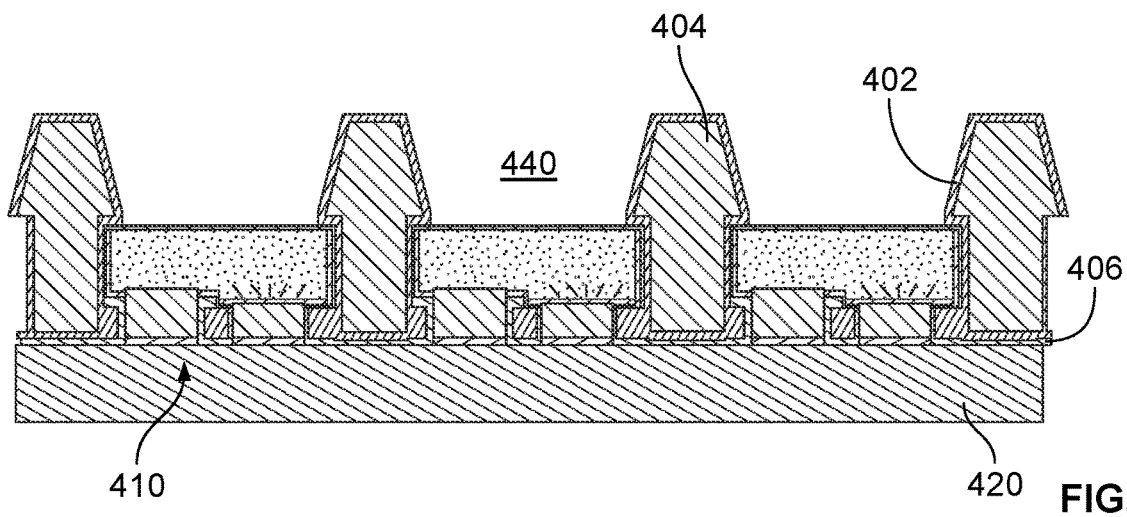

FIG. 7A depicts the process following FIG. 6B wherein wall material 404 is deposited to fill trenches between the micro-LEDs 410 formed by the first metallic layer 402a to a depth and underfill the electrical contacts. The wall material 404 is exposed and developed such that the portion below the light-emitting layers of the micro-LEDs (e.g., a top surface) has substantially vertical side surfaces and the upper portion above the light-emitting layers (e.g., a top portion) forms canted side surfaces.

The process involving the application of a second metallic layer 402b, a photoresist layer 405 deeper than the isolation walls, the formation of a metal-etching mask by exposing and developing the photoresist layer 405, the removal of the second metallic layer 402b above the micro-LEDs 410, and the final removal of remaining photoresist layer 405 is depicted in FIGS. 7B-7F.

Particular embodiments of the subject matter have been described. Other embodiments are within the scope of the following claims. Operations are depicted in the drawings and recited in the claims in a particular order, this should not be understood as requiring that such operations be performed in the particular order shown or in sequential order, or that all illustrated operations be performed, to achieve desirable results. For example, the actions recited in the claims can be performed in a different order and still achieve desirable results. As one example, the processes depicted in the accompanying figures do not necessarily require the particular order shown, or sequential order, to achieve desirable results.

What is claimed is:

1. A method for manufacturing micro-LED displays, comprising:
   depositing a first material over a substrate having a plurality of micro-LEDs that emit light in a first wavelength range such that the plurality of micro-LEDs are covered by the first material and the first material fills gaps laterally separating the micro-LEDs;
   removing a portion of the first material from the gaps that laterally separate the plurality of micro-LEDs to form trenches in the first material that extend to or below light-emitting layers of the micro-LEDs;
   depositing a second material over the substrate such that the second material covers the first material and extends into the trenches in the first material;
   removing a portion of the first and second materials over the plurality of micro-LEDs to form wells over each the plurality of micro-LEDs and such that a plurality of walls of the second material positioned in the gaps between the plurality of micro-LEDs extend vertically higher than a top surface of the first material;
   depositing a third material that conformally coats bottoms of the wells and surfaces of the walls of the second material to form isolation walls between the plurality of micro-LEDs, wherein the third material has higher opacity than the second material and has transmittance less than 1% of light in the first wavelength range; and
   removing a portion of the third material over the micro-LEDs at the bottoms of the wells.

2. The method of claim 1, wherein the first material is a photoresist material, or a redistribution layer material.

3. The method of claim 1, wherein removing the portion of the first and second materials over the micro-LEDs includes removal of the portion of the second material over the micro-LEDs until top surfaces of the micro-LEDs are exposed.

4. The method of claim 1, wherein removing the portion of the first and second materials over the micro-LEDs includes removal of the second material across regions over the micro-LEDs and over gaps between the micro-LEDs until the first material is exposed.

5. The method of claim 1, the method further comprising:
   depositing a fourth material over the third material such that the third material is covered and an area between the isolation walls of the second material coated in the third material are filled; and
   removing a portion of the fourth material over the micro-LEDs to expose top surfaces of the micro-LEDs.

6. The method of claim 5, wherein the third material is a metal.

7. The method of claim 6, wherein the fourth material is a photoresist material.

8. The method of claim 7, wherein the fourth material provides a mask over the isolation walls during removal of the third material over the micro-LEDs.

9. The method of claim 1, wherein the first material is a photoresist.

10. The method of claim 1, wherein the first materials blocks at least a portion of the light emitted by the micro-LEDs.

11. The method of claim 1, wherein the second material has greater than 95% transmission to the first wavelength range.

12. The method of claim 1, wherein the second material is a photoresist.

13. The method of claim 12, wherein the second materials is a negative photoresist.

14. The method of claim 1, wherein the third material is a metal.

15. The method of claim 1, further comprising depositing color conversion layers into the wells over each micro-LED to convert ultraviolet light from the micro-LED to a visible light.

* * * * *